US012751125B2

(12) United States Patent
Im et al.

(10) Patent No.: US 12,751,125 B2
(45) Date of Patent: Sep. 29, 2026

(54) DISPLAY DEVICE AND METHOD FOR FABRICATING THE SAME

(71) Applicant: Samsung Display Co., LTD., Yongin-si (KR)

(72) Inventors: Hyun Deok Im, Yongin-si (KR); Buem Joon Kim, Yongin-si (KR); Soo Jo Ock, Yongin-si (KR); Won Ho Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 344 days.

(21) Appl. No.: 18/625,090

(22) Filed: Apr. 2, 2024

(65) Prior Publication Data

US 2024/0363819 A1 Oct. 31, 2024

(30) Foreign Application Priority Data

Apr. 26, 2023 (KR) ........................ 10-2023-0054913

(51) Int. Cl.
*H10H 20/857* (2025.01)
*H10H 20/01* (2025.01)
(Continued)

(52) U.S. Cl.
CPC ........ *H10H 20/857* (2025.01); *H10H 20/831* (2025.01); *H10W 90/00* (2026.01); *H10H 20/032* (2025.01); *H10H 20/0364* (2025.01)

(58) Field of Classification Search
CPC .. H10H 20/831; H10H 20/857; H10H 20/032; H10H 20/0364; H10W 90/00
(Continued)

(56) References Cited

U.S. PATENT DOCUMENTS 9,329,433 B2 * 5/2016 Negishi ............. G02F 1/133603
11,600,756 B2 * 3/2023 Kim ....................... H10H 20/84
(Continued)

FOREIGN PATENT DOCUMENTS

KR 10-1490758 B1 2/2015
KR 2021-0141828 A 11/2021
(Continued)

OTHER PUBLICATIONS

International Search Report dated Apr. 8, 2024 for corresponding PCT Application No. PCT/KR2023/022036 (3 pages).

*Primary Examiner* — Pritham D Prabhakher
(74) *Attorney, Agent, or Firm* — Womble Bond Dickinson (US) LLP

(57) ABSTRACT

A display device includes a substrate, a first electrode, a second electrode, and a third electrode extending in a first direction on the substrate and spaced from each other, a first insulating layer on the first electrode, the second electrode, and the third electrode and including openings exposing an upper surface of the first electrode, a bank layer on the first electrode, the second electrode, the third electrode, and the first insulating layer to partition an emission area, light-emitting elements on the first electrode and the first insulating layer, and a first connection electrode in contact with one ends of the light-emitting elements and a second connection electrode in contact with opposite ends of the light-emitting elements, wherein the light-emitting elements are in contact with the upper surface of the first electrode through the openings of the first insulating layer.

25 Claims, 31 Drawing Sheets

(51) Int. Cl.
*H10H 20/831* (2025.01)
*H10W 90/00* (2026.01)

(58) Field of Classification Search
USPC .......................................................... 257/79
See application file for complete search history.

(56) References Cited

U.S. PATENT DOCUMENTS

| | | | | |
|---|---|---|---|---|
| 11,754,893 | B2 * | 9/2023 | Douyou | H10D 30/6723 257/72 |
| 11,785,809 | B2 * | 10/2023 | Lee | H10K 59/122 257/40 |
| 12,087,882 | B2 * | 9/2024 | Song | H10H 20/8312 |
| 12,349,562 | B2 * | 7/2025 | Kim | H10H 20/857 |
| 12,396,308 | B2 * | 8/2025 | Lin | H10H 20/857 |
| 12,550,554 | B2 * | 2/2026 | Kim | H10K 59/131 |
| 12,557,451 | B2 * | 2/2026 | Cha | H10H 20/857 |
| 12,568,852 | B2 * | 3/2026 | Bae | H10W 90/00 |
| 2013/0027623 | A1 | 1/2013 | Negishi et al. | |
| 2021/0057623 | A1 * | 2/2021 | Kim | H10H 20/84 |
| 2022/0077254 | A1 * | 3/2022 | Lee | H10K 59/122 |
| 2022/0140194 | A1 * | 5/2022 | Song | H10H 20/8312 257/40 |
| 2022/0208936 | A1 * | 6/2022 | Kim | H10H 20/857 |
| 2022/0293672 | A1 * | 9/2022 | Kim | H10H 20/857 |
| 2022/0328465 | A1 * | 10/2022 | Bae | H10W 90/00 |
| 2022/0365397 | A1 * | 11/2022 | Douyou | G02F 1/13685 |
| 2022/0384490 | A1 * | 12/2022 | Hong | G09G 3/3258 |
| 2022/0384697 | A1 * | 12/2022 | Lin | H10H 20/857 |
| 2023/0142777 | A1 * | 5/2023 | Cha | H10H 29/142 257/89 |
| 2023/0231096 | A1 * | 7/2023 | Cha | H10H 20/857 257/91 |
| 2023/0387369 | A1 * | 11/2023 | Kim | H10H 20/857 |

FOREIGN PATENT DOCUMENTS

| | | | |
|---|---|---|---|
| KR | 2022-0037044 | A | 3/2022 |
| KR | 2022-0067647 | A | 5/2022 |
| KR | 2022-0075585 | A | 6/2022 |
| KR | 2022-0145947 | A | 10/2022 |
| KR | 10-2513267 | B1 | 3/2023 |
| KR | 2023-0033473 | A | 3/2023 |

* cited by examiner

ED : ED1, ED2
RME : RME1, RME2, RME3
CNE : CNE1, CNE2, CNE3

DISPLAY DEVICE AND METHOD FOR FABRICATING THE SAME

CROSS-REFERENCE TO RELATED APPLICATION

The present application claims priority to and the benefit of Korean Patent Application No. 10-2023-0054913, filed on Apr. 26, 2023, in the Korean Intellectual Property Office, the entire disclosure of which is incorporated by reference herein.

BACKGROUND

1. Field

The present disclosure relates to a display device and a method of fabricating the same.

2. Description of the Related Art

Display devices become more and more important as multimedia technology evolves. Accordingly, a variety of types of display devices such as organic light-emitting diode (OLED) display devices and liquid-crystal display (LCD) devices are currently used.

A display device may include a display panel such as a light-emitting display panel and a liquid-crystal display panel for displaying images. Among them, the light-emitting display panel may include a light-emitting element such as a light-emitting diode (LED). Examples of the light-emitting diodes may include an organic light-emitting diode using an organic material as a light-emitting material, an inorganic light-emitting diode using an inorganic material as a light-emitting material, etc.

SUMMARY

Aspects of the present disclosure provide a display device in which light-emitting elements can be aligned via a simpler process with improved alignment degree, and a method of fabricating the same.

It should be noted that aspects and features of embodiments of the present disclosure are not limited to the above-mentioned aspects and features; and other aspects and features of the present disclosure will be apparent to those skilled in the art from the following descriptions.

According to one or more embodiments of the present disclosure, a display device includes a substrate, a first electrode, a second electrode, and a third electrode extending in a first direction on the substrate and spaced from each other, a first insulating layer on the first electrode, the second electrode and the third electrode and including openings exposing an upper surface of the first electrode, a bank layer on the first electrode, the second electrode, the third electrode, and the first insulating layer to partition an emission area, light-emitting elements on the first electrode and the first insulating layer, and a first connection electrode in contact with one ends of the light-emitting elements and a second connection electrode in contact with opposite ends of the light-emitting elements, wherein the light-emitting elements are in contact with the upper surface of the first electrode through the openings of the first insulating layer.

In one or more embodiments, the openings include a first opening exposing one side of the upper surface of the first electrode and a second opening exposing an opposite side of the upper surface of the first electrode, and wherein the first opening and the second opening are extended in the first direction and arranged in parallel to each other.

In one or more embodiments, the first insulating layer is extended from a top of the first electrode in a second direction crossing the first direction to cover an edge of the second electrode and an edge of the third electrode.

In one or more embodiments, the second electrode includes a first region that does not overlap the bank layer and the first insulating layer and exposes an upper surface of the second electrode, and wherein the third electrode includes a second region that does not overlap the bank layer and the first insulating layer and exposes an upper surface of the third electrode.

In one or more embodiments, the first region and the second region are extended in the first direction and are arranged in parallel to each other, and a width of each of the first region and the second region in the second direction is greater than a length of the light-emitting elements.

In one or more embodiments, the first insulating layer includes a third opening exposing an upper surface of the second electrode and a fourth opening exposing an upper surface of the third electrode, and wherein a width of each of the third opening and the fourth opening in a second direction crossing the first direction is greater than a length of the light-emitting elements.

In one or more embodiments, the light-emitting elements include a first light-emitting element between the first electrode and the second electrode, and a second light-emitting element between the first electrode and the third electrode, wherein the first light-emitting element is in contact with the upper surface of the first electrode through the first opening, and wherein the second light-emitting element is in contact with the upper surface of the first electrode through the second opening.

In one or more embodiments, a first end of the first light-emitting element overlaps the first electrode, and a second end of the first light-emitting element does not overlap the first electrode and the second electrode, and wherein a first end of the second light-emitting element overlaps the first electrode, and a second end of the second light-emitting element does not overlap the first electrode and the third electrode.

In one or more embodiments, the first light-emitting element and the second light-emitting element are spaced from each other with the first insulating layer between the first opening and the second opening, and wherein the first end of the first light-emitting element and the first end of the second light-emitting element are in contact with side surfaces of the first insulating layer, respectively.

In one or more embodiments, the first connection electrode is in contact with the first end of the first light-emitting element and the first end of the second light-emitting element, and wherein the second connection electrode is in contact with the second end of the first light-emitting element and the second end of the second light-emitting element.

In one or more embodiments, the second connection electrode includes a first extended portion extending in the first direction, a second extended portion spaced from and facing the first extended portion, and a first bridge portion connecting between the first extended portion and the second extended portion, and wherein the first extended portion is in contact with the second end of the first light-emitting element, and the second extended portion is in contact with the second end of the second light-emitting element.

In one or more embodiments, the openings include a third opening spaced from the first opening in the first direction and exposing the one side of the upper surface of the first electrode, and a fourth opening spaced from the second opening in the first direction and exposing the opposite side of the upper surface of the first electrode, wherein the light-emitting elements includes a third light-emitting element between the first electrode and the second electrode and a fourth light-emitting element between the first electrode and the third electrode, and wherein the third light-emitting element is in contact with the upper surface of the first electrode through the third opening, and the fourth light-emitting element is in contact with the upper surface of the first electrode through the fourth opening.

In one or more embodiments, the second connection electrode comprises a third extended portion extending in the first direction from the first bridge portion, wherein the display device further includes a third connection electrode including a fourth extended portion extending in the first direction and spaced from the first extended portion in the first direction, a fifth extended portion extending in the first direction and spaced from the second extended portion in the first direction, and a second bridge portion connecting between the fourth extended portion and the fifth extended portion, wherein the third extended portion is in contact with a first end of the third light-emitting element and a first end of the fourth light-emitting element, and wherein the fourth extended portion is in contact with a second end of the third light-emitting element, and the fifth extended portion is in contact with a second end of the fourth light-emitting element.

According to an aspect of the present disclosure, a display device includes a substrate, a first electrode, a second electrode, a third electrode, a fourth electrode and a fifth electrode extending in a first direction on the substrate and spaced from one another, a first insulating layer on the first electrode, the second electrode, the third electrode, the fourth electrode, and the fifth electrode and including openings exposing an upper surface of the first electrode, a bank layer on the first electrode, the second electrode, the third electrode, the fourth electrode, the fifth electrode and the first insulating layer to partition an emission area, light-emitting elements on the first electrode and the first insulating layer, and a first connection electrode in contact with one ends of the light-emitting elements and a second connection electrode in contact with opposite ends of the light-emitting elements, wherein the light-emitting elements are in contact with the upper surface of the first electrode through the openings of the first insulating layer, and wherein the light-emitting elements do not overlap with the second electrode, the third electrode, the fourth electrode, and the fifth electrode.

In one or more embodiments, the second electrode is spaced from one side of the first electrode, the third electrode is spaced from an opposite side of the first electrode, the fourth electrode is between the first electrode and the second electrode, and the fifth electrode is between the first electrode and the third electrode.

In one or more embodiments, the light-emitting elements include a first light-emitting element between the first electrode and the fourth electrode, and a second light-emitting element between the first electrode and the fifth electrode.

In one or more embodiments, a first end of the first light-emitting element overlaps the first electrode, and a second end of the first light-emitting element does not overlap the fourth electrode, and wherein a first end of the second light-emitting element overlaps the first electrode, and a second end of the second light-emitting element does not overlap the fifth electrode.

According to an aspect of the present disclosure, a method of fabricating a display device, the method includes forming a first electrode, a second electrode and a third electrode spaced from each other on a substrate, forming a first insulating layer comprising openings on the first electrode, the second electrode and the third electrode to expose parts of an upper surface of the first electrode, forming a bank layer on the first electrode, the second electrode, the third electrode and the first insulating layer to define an emission area, spraying ink containing light-emitting elements onto the emission area, performing a first alignment process of aligning the light-emitting elements on the second electrode and the third electrode by applying a first alignment signal to the first electrode, the second electrode and the third electrode, performing a second alignment process of aligning the light-emitting elements on the first electrode by applying a second alignment signal to the first electrode, the second electrode and the third electrode, and forming a first connection electrode in contact with first ends of the light-emitting elements and a second connection electrode in contact with second ends of the light-emitting elements.

In one or more embodiments, the first insulating layer is formed via a patterning process to form a first region in which an upper surface of the second electrode is exposed and a second region in which an upper surface of the third electrode is exposed.

In one or more embodiments, the first alignment process is performed by applying the first alignment signal in a form of a DC voltage to the first electrode, the second electrode and the third electrode, and a negative voltage is applied to the first electrode and a positive voltage is applied to the second electrode and the third electrode as the first alignment signal.

In one or more embodiments, in the first alignment process, the light-emitting elements are aligned and arranged on the first region of the second electrode and the second region of the third electrode.

In one or more embodiments, the second alignment process is performed by applying the second alignment signal in a form of a DC voltage to the first electrode, the second electrode and the third electrode, and a positive voltage is applied to the first electrode and a negative voltage is applied to the second electrode and the third electrode as the second alignment signal.

In one or more embodiments, in the second alignment process, the light-emitting elements are aligned on the first electrode and are in direct contact with the upper surface of the first electrode through the openings.

In one or more embodiments, the method further includes forming a fourth electrode between the first electrode and the second electrode, and forming a fifth electrode between the first electrode and the third electrode, wherein the first electrode, the second electrode, the third electrode, the fourth electrode and the fifth electrode are formed concurrently.

In one or more embodiments, the method further includes performing a drying process of removing a solvent from the ink after the second alignment process, wherein during the drying process, an AC voltage is applied to the first electrode and a constant voltage is applied to the second electrode, the third electrode, the fourth electrode and the fifth electrode.

According to one or more embodiments of the present disclosure, a plurality of openings exposing a first electrode is formed in a first insulating layer in a display device, and a direct current signal is applied to align the light-emitting elements, so that the positions where the light-emitting elements are finally aligned can be controlled and the alignment degree can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
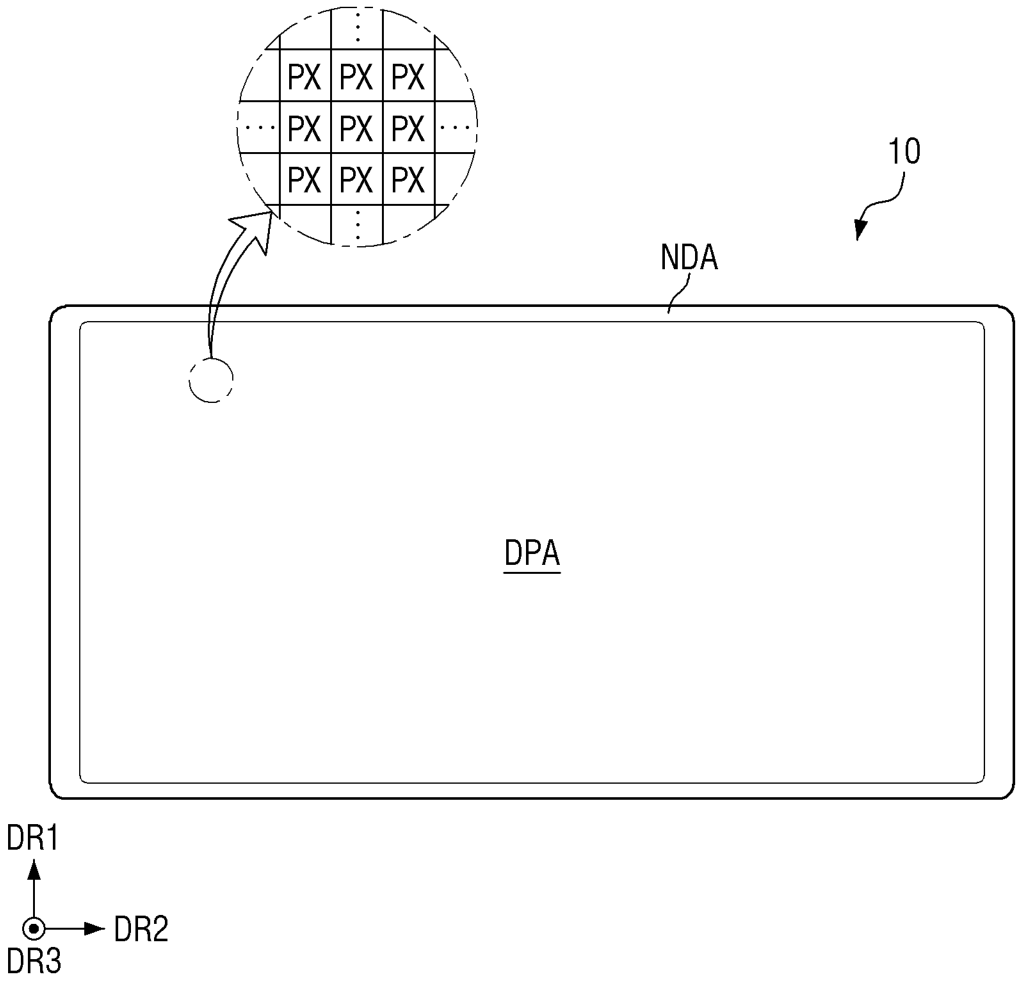
FIG. 1 is a plan view of a display device according to one or more embodiments of the present disclosure.

FIG. 1 is a plan view of a display device according to one or more embodiments of the present disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other display panel may be employed as long as the technical idea of the present disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (e.g., vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include a display area DPA and a non-display area NDA along an edge or periphery of the display area DPA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be, but is not limited to, a rectangle or a square when viewed from the top. Each pixel may have a diamond shape having sides inclined with respect to a direction. The pixels PX may be arranged in stripes or in a pattern of islands. Each of the pixels PX may include one or more light-emitting elements each emitting light of a particular wavelength band to represent a color.

The non-display area NDA may be disposed around the display area DPA. The non-display area NDA may be around (e.g., may surround) the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
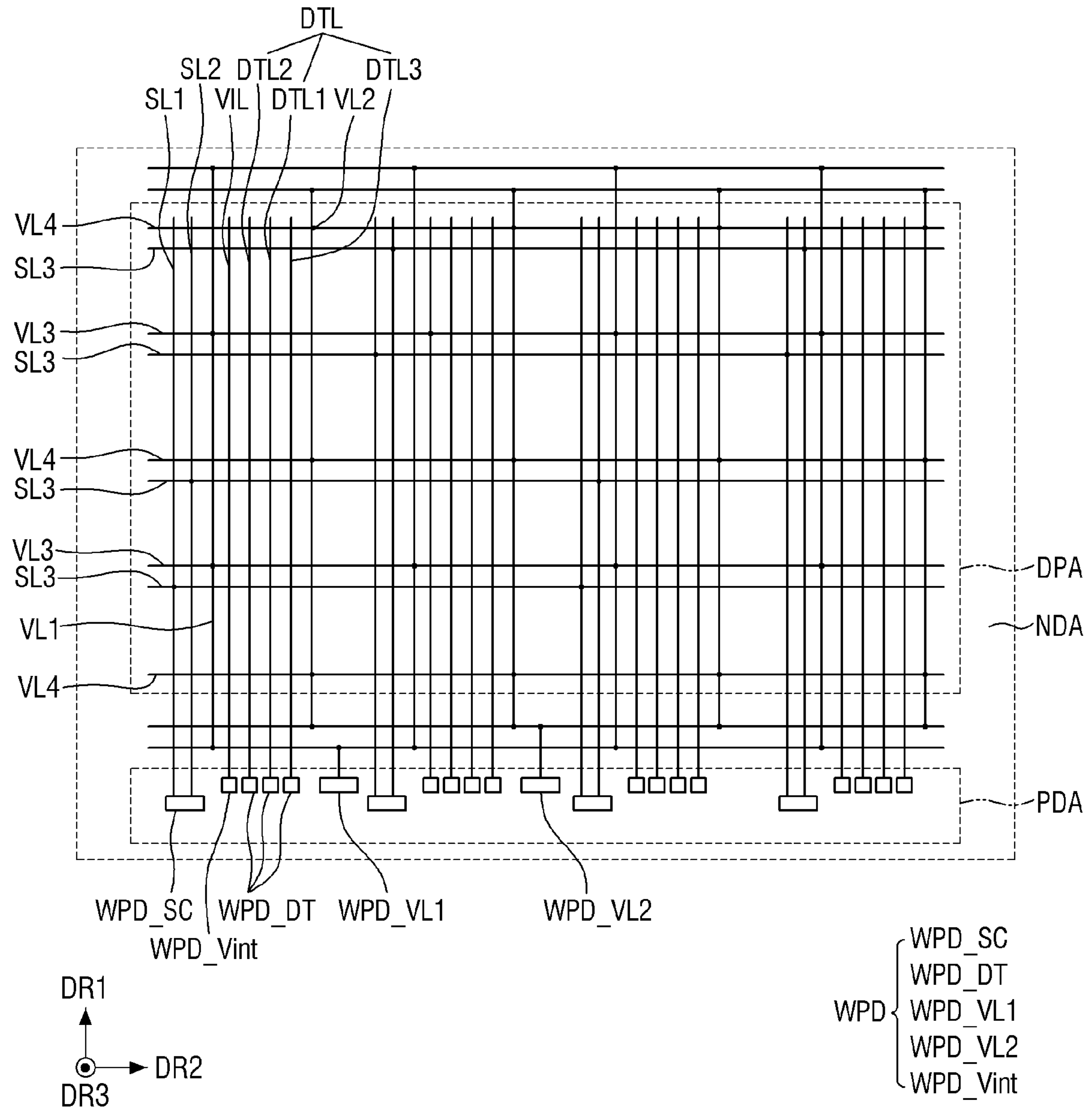
FIG. 2 is a plan view showing arrangement of a plurality of lines included in a display device according to one or more embodiments of the present disclosure.

FIG. 2 is a plan view showing arrangement of a plurality of lines included in a display device according to one or more embodiments of the present disclosure.

Referring to FIG. 2, the display device 10 may include a plurality of lines. The display device 10 may include a plurality of scan lines SL: SL1, SL2, and SL3, a plurality of data lines DTL; DTL1, DTL2, and DTL3, an initialization voltage line VIL, and a plurality of voltage lines VL; VL1, VL2, VL3, and VL4. Although not shown in the drawings, other lines may be further disposed in the display device 10.

The first scan line SL1 and the second scan line SL2 may be extended in the first direction DR1. The first scan line SL1 and the second scan line SL2 may be disposed adjacent to each other, and may be spaced from other first and second scan lines SL1 and SL2 in the second direction DR2. The first scan line SL1 and the second scan line SL2 may be connected to a scan wire pad WPD_SC connected to a scan driver. The first scan line SL1 and the second scan line SL2 may be extended from a pad area PDA located in the non-display area NDA to the display area DPA.

The third scan line SL3 may be extended in the second direction DR2, and may be spaced from another third scan line SL3 in the first direction DR1. One third scan line SL3 may be connected to one or more first scan lines SL1 or one or more second scan lines SL2. According to one or more embodiments of the present disclosure, the first scan line SL1 and the second scan line SL2 may be formed as a conductive layer that is disposed on a different layer from the third scan line SL3. The plurality of scan lines SL may have, but is not limited to, a mesh structure on the entire surface of the display area DPA.

As used herein, when an element is referred to as being "connected" or "coupled" to another element, it can be directly connected or coupled to the element or intervening elements may be present. In addition, such elements may be understood as a single integrated element with one portion thereof connected to another portion. Moreover, when an element is referred to as being "connected" to another element, it may be in direct contact with the element and also electrically connected to the element.

The data lines DTL may be extended in the first direction DR1. The data lines DTL may include a first data line DTL1, a second data line DTL2 and a third data line DTL3. The first to third data lines DTL1, DTL2, and DTL3 are disposed adjacent to one another as a group. The data lines DTL1, DTL2, and DTL3 may be extended from the pad area PDA located in the non-display area NDA to the display area DPA. It should be understood, however, that the present disclosure is not limited thereto. The data lines DTL may be equally spaced from one another a first voltage line VL1 and a second voltage line VL2 to be described later.

The initialization voltage line VIL may be extended in the first direction DR1. The initialization voltage line VIL may be disposed between the data lines DTL and the first and second scan lines SL1 and SL2. The initialization voltage line VIL may be extended from the pad area PDA located in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be arranged alternately in the second direction DR2, and the third voltage line VL3 and the fourth voltage line VL4 may be arranged alternately in the first direction DR1. The first voltage lines VL1 and the second voltage lines VL2 may be extended in the first direction DR1 and may traverse the display area DPA. Some of the third voltage line VL3 and the fourth voltage lines VL4 may be disposed in the display area DPA while the others may be disposed in the non-display area NDA located on the both sides of the display area DPA in the first direction DR1. The first voltage lines VL1 and the second voltage lines VL2 may be formed as a conductive layer disposed on a different layer from the third voltage lines VL3 and the fourth voltage lines VL4. The first voltage line VL1 may be connected to at least one third voltage line VL3, and the second voltage line VL2 may be connected to at least one fourth voltage line VL4, such that the plurality of voltage lines VL may have a mesh structure in the entirely display are DPA. It is, however, to be understood that the present disclosure is not limited thereto.

The first scan lines SL1, the second scan lines SL2, the data lines DTL, the initialization voltage line VIL, the first voltage lines VL1 and the second voltage lines VL2 may be electrically connected to one or more wire pads WPD. The wire pads WPD may be disposed in the non-display areas NDA. According to one or more embodiments of the present disclosure, the wire pads WPD may be disposed in the pad area PDA located on the lower side of the display area DPA that is the opposite in the first direction DR1. The first and second scan lines SL1 and SL2 may be connected to the scan wire pad WPD_SC disposed in the pad area PDA, and the data lines DTL may be connected to different data wire pads WPD_DT, respectively. The initialization voltage line VIL may be connected to the initialization wiring pad WPD-_Vint, the first voltage line VL1 may be connected to a first voltage wire pad WPD_VL1, and the second voltage line VL2 may be connected to the second voltage wire pad WPD_VL2. External devices may be mounted on the wire pads WPD. External devices may be mounted on the wire pads WPD by an anisotropic conductive film, ultrasonic bonding, etc. Although the wire pads WPD are disposed in the pad area PDA located on the lower side of the display area DPA in the drawings, the present disclosure is not limited thereto. Some of the plurality of wire pads WPD may be disposed on the upper side or on one of the left and right sides of the display area DPA.

Each of the pixels PX or sub-pixels SPXn of the display device 10 includes a pixel driving circuit, where n is an integer of 1 to 3. The above-described lines may pass through each of the pixels PX or the periphery thereof to apply a driving signal to the pixel driving circuit. The pixel driving circuit may include transistors and a capacitor. The numbers of transistors and capacitors of each pixel driving circuit may be changed in a variety of ways. According to one or more embodiments of the present disclosure, each of the sub-pixels SPXn of the display device 10 may have a 3T1C structure, i.e., a pixel driving circuit includes three transistors and one capacitor. In the following description, the pixel driving circuit having the 3T1C structure will be described as an example. It is, however, to be understood that the present disclosure is not limited thereto. A variety of modified structure may be employed such as a 2T1C structure, a 7T1C structure and a 6T1C structure.

Figure 3:
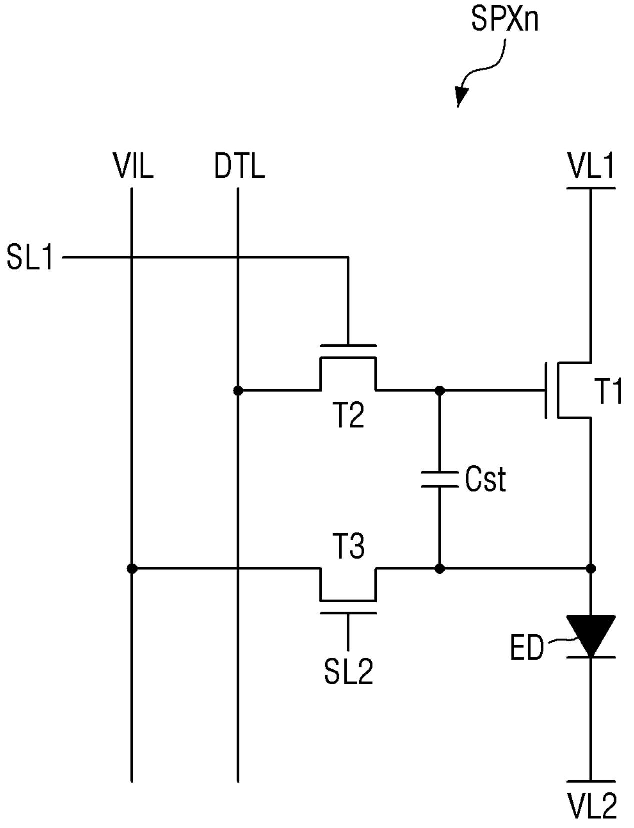
FIG. 3 is an equivalent circuit diagram of a sub-pixel according to one or more embodiments of the present disclosure.

FIG. 3 is an equivalent circuit diagram of a sub-pixel according to one or more embodiments of the present disclosure.

Referring to FIG. 3, each of the sub-pixels SPXn of the display device 10 according to one or more embodiments includes three transistors T1, T2, and T3 and one storage capacitor Cst in addition to a light-emitting diode ED.

The light-emitting diode ED emits light in proportional to the current supplied through the first transistor T1. The light-emitting diode ED includes a first electrode, a second electrode, and at least one light-emitting element disposed therebetween. The light-emitting diode ED may emit light in a particular wavelength range by an electric signal transmitted from the first electrode and the second electrode.

A first end of the light-emitting diode ED may be connected to a source electrode of the first transistor T1, and a second end thereof may be connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting diode ED according to the voltage difference between a gate electrode and the source electrode of the first transistor T1. For example, the first transistor T1 may be a driving transistor for driving the light-emitting diode ED. The gate electrode of the first transistor T1 may be connected to a source electrode of the second transistor T2, the source electrode thereof may be connected to the first electrode of the light-emitting diode ED, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting diode ED. The gate electrode of the third transistor T3 may be connected to the second scan line SL2, the drain electrode thereof may be connected to the initialization voltage line VIL, and the source electrode thereof may be connected to one end of the light-emitting diode ED or the source electrode of the first transistor T1.

The source electrode and the drain electrode of each of the transistors T1, T2, and T3 are not limited to those described above. They may be connected in the opposite way. In addition, each of the transistors T1, T2, and T3 may be formed as a thin-film transistor (TFT). In addition, although each of the transistors T1, T2, and T3 implemented as an n-type metal oxide semiconductor field effect transistor (MOSFET) in the example shown in FIG. 3, the present disclosure is not limited thereto. That is to say, each of the transistors T1, T2, and T3 may be implemented as a p-type MOSFET, or some of the transistors T1, T2, and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

Hereinafter, the structure of one pixel PX of the display device 10 according to an embodiment will be described in detail with reference to other drawings.

Figure 4:
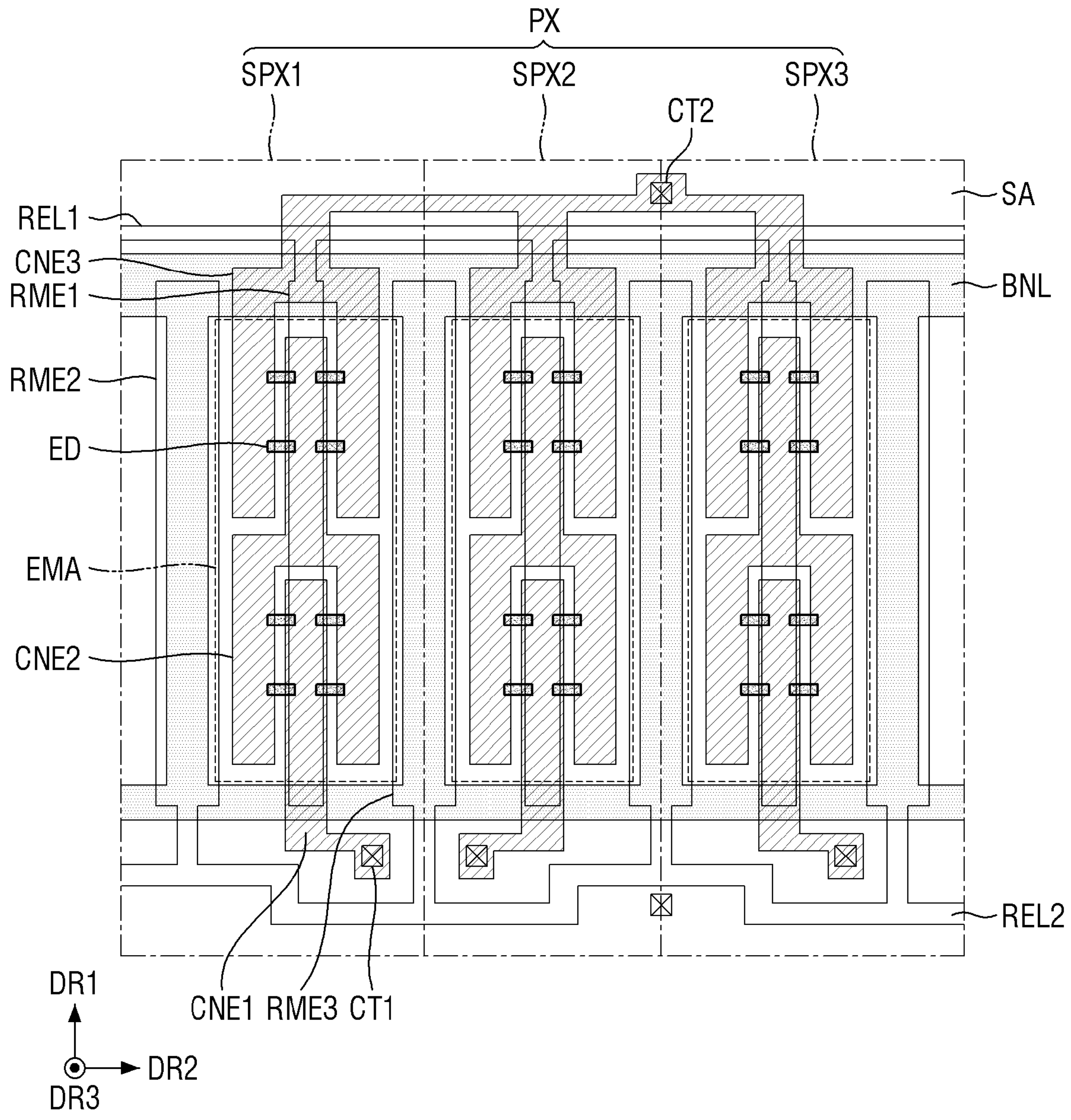
FIG. 4 is a plan view showing a pixel of a display device according to one or more embodiments of the present disclosure.

FIG. 4 is a plan view showing a pixel of a display device according to an embodiment of the present disclosure.

FIG. 4 shows arrangements of electrodes RME: RME1, RME2, and RME3, a bank layer BNL, a plurality of light-emitting elements ED, and connection electrodes CNE: CNE1, CNE2, and CNE3 disposed in a pixel PX of a display device when viewed from the top.

Referring to FIG. 4, each of the pixels PX of the display device 10 may include a plurality of sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the present disclosure is not limited thereto. All the sub-pixels SPXn may emit light of the same color. According to one or more embodiments of the present disclosure, the sub-pixels SPXn may emit blue light. Although the single pixel PX includes three sub-pixels SPXn in the example shown in the drawings, the present disclosure is not limited thereto. The pixel PX may include more than three sub-pixels SPXn.

Each of the sub-pixels SPXn of the display device 10 may include an emission area EMA and a non-emission area. In the emission area EMA, light-emitting elements ED are disposed to emit light of a particular wavelength band. In the non-emission area, the light-emitting elements ED are not disposed and the lights emitted from the light-emitting elements ED do not reach, and thus no light exits therefrom.

The emission area EMA may include an area in which the light-emitting elements ED are disposed, and may include an area adjacent to the light-emitting elements ED where lights emitted from the light-emitting elements ED exit. For example, the emission area EMA may also include an area in which lights emitted from the light-emitting elements ED are reflected or refracted by other elements to exit. The plurality of light-emitting elements ED may be disposed in each of the sub-pixels SPXn, and the emission area may include the area where the light-emitting elements are disposed and the adjacent area.

Although the emission areas EMA of the sub-pixels SPXn have the equal area in the example shown in the drawings, the present disclosure is not limited thereto. In some embodiments, the emission areas EMA of the sub-pixels SPXn may have different areas depending on a color or wavelength band of light emitted from the light-emitting elements ED disposed in the respective sub-pixels.

Each of the sub-pixels SPXn may further include a subsidiary area SA disposed in the non-emission area. The subsidiary area SA of each sub-pixel SPXn may be disposed on the upper side and/or the lower side of the emission area EMA in the first direction DR1. The emission areas EMA and the subsidiary areas SA may be arranged alternately in the first direction DR1, and each subsidiary area SA may be disposed between the emission areas EMA of different sub-pixels SPXn that are spaced from each other in the first direction DR1. For example, the emission areas EMA and the subsidiary areas SA may be alternately arranged in the first direction DR1, and the emission areas EMA and the subsidiary areas SA may be repeatedly arranged in the second direction DR2. It is, however, to be understood that the present disclosure is not limited thereto. The emission areas EMA and the subsidiary areas SA of the plurality of pixels PX may have an arrangement different from that of FIG. 4.

No light-emitting diode ED is disposed in the subsidiary areas SA and thus no light exits therefrom. The electrodes RME disposed in the sub-pixels SPXn may be partially disposed in the subsidiary areas SA. In the subsidiary area SA, electrode lines REL1 and REL2 may be disposed, which are extended in the second direction DR2 and connected to the electrodes RME of the sub-pixels SPX1, SPX2, and SPX3. For example, in the subsidiary area SA on the upper side of the emission area EMA, a first electrode line REL1 may be disposed, to which the first electrode RME1 of each of the sub-pixels SPX1, SPX2, and SPX3 is extended to be connected. In the subsidiary area SA on the lower side of the emission area EMA, a second electrode line REL2 may be disposed, to which the second and third electrode RME2 and RME3 of each of the sub-pixels SPX1, SPX2, and SPX3 are extended to be connected.

The lines and circuit elements of a circuit layer disposed in each pixel PX and connected to the light-emitting elements ED may be connected to the first to third sub-pixels SPX1, SPX2, and SPX3. It should be noted that the lines and circuit elements may not be disposed in the area occupied by each sub-pixel SPXn or the emission area EMA but may be disposed regardless of the location of the emission area EMA in one pixel PX.

The bank layer BNL may be disposed to be around (e.g., to surround) the plurality of sub-pixels SPXn, the emission area EMA, and the subsidiary area SA. The bank layer BNL may be disposed at the boundary between the sub-pixels SPXn adjacent to each other in the first direction DR1 and the second direction DR2, and may also be disposed at the boundary between the emission area EMA and the subsidiary area SA. The sub-pixels SPXn, the emission areas EMA, and the subsidiary areas SA of the display device 10 may be distinguished from one another by the bank layer BNL. The distance between the plurality of sub-pixels SPXn, the emission areas EMA, and the subsidiary areas SA may vary depending on the width of the bank layer BNL.

The bank layer BNL may be disposed in a ladder pattern on the front surface of the display area DPA including portions extended in the first direction DR1 and the second direction DR2 when viewed from the top. The bank layer BNL may be disposed along the border of each of the sub-pixels PXn to distinguish between adjacent sub-pixels SPXn. In addition, the bank layer BNL may be disposed to be around (e.g., to surround) the emission area EMA and the subsidiary area SA disposed in each of the sub-pixels SPXn to distinguish between them.

Figure 5:
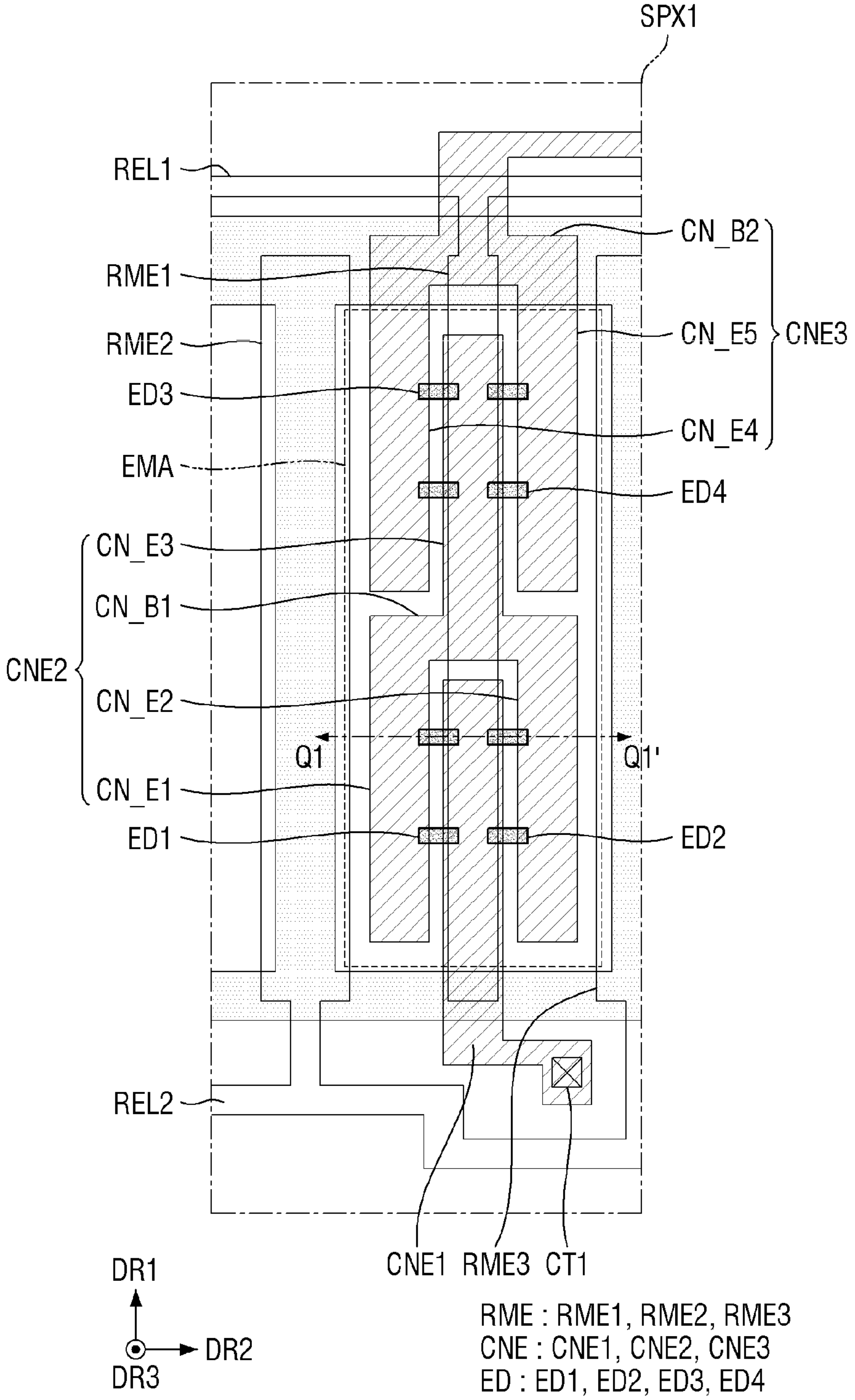
FIG. 5 is a plan view showing the first sub-pixel of FIG. 4.
Figure 6:
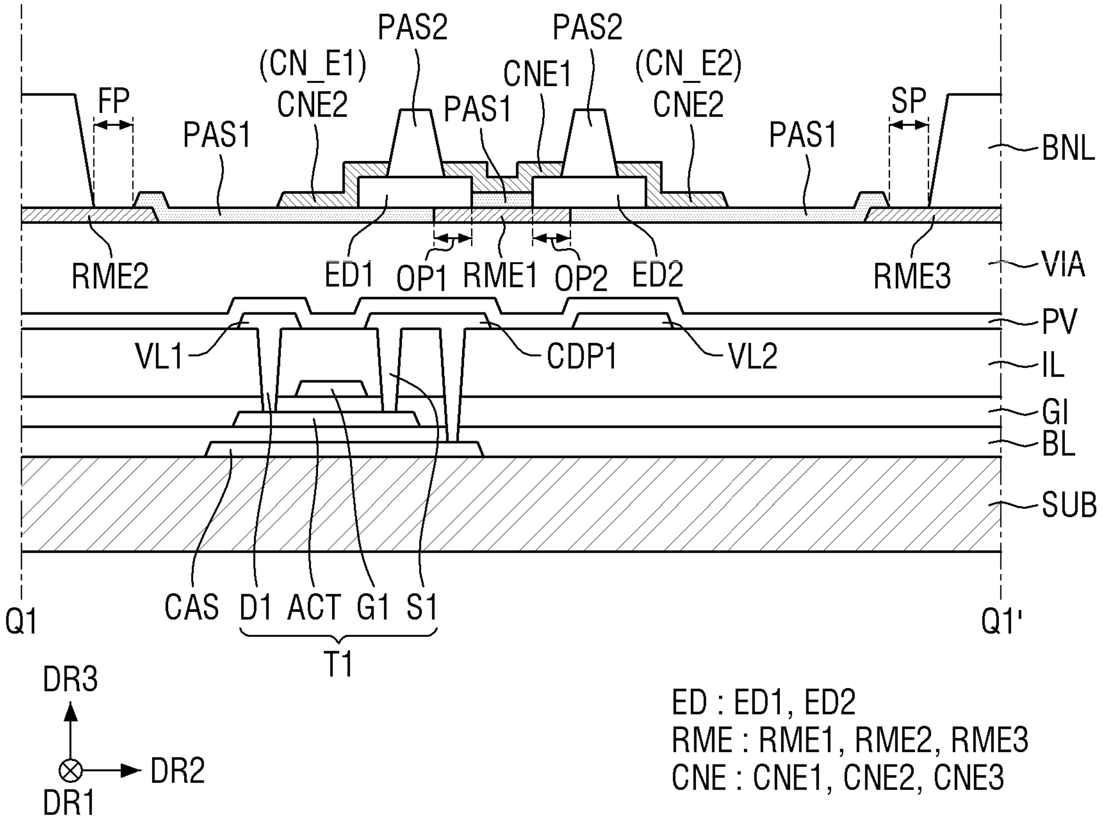
FIG. 6 is a cross-sectional view taken along the line Q1-Q1' of FIG. 5.
Figure 7:
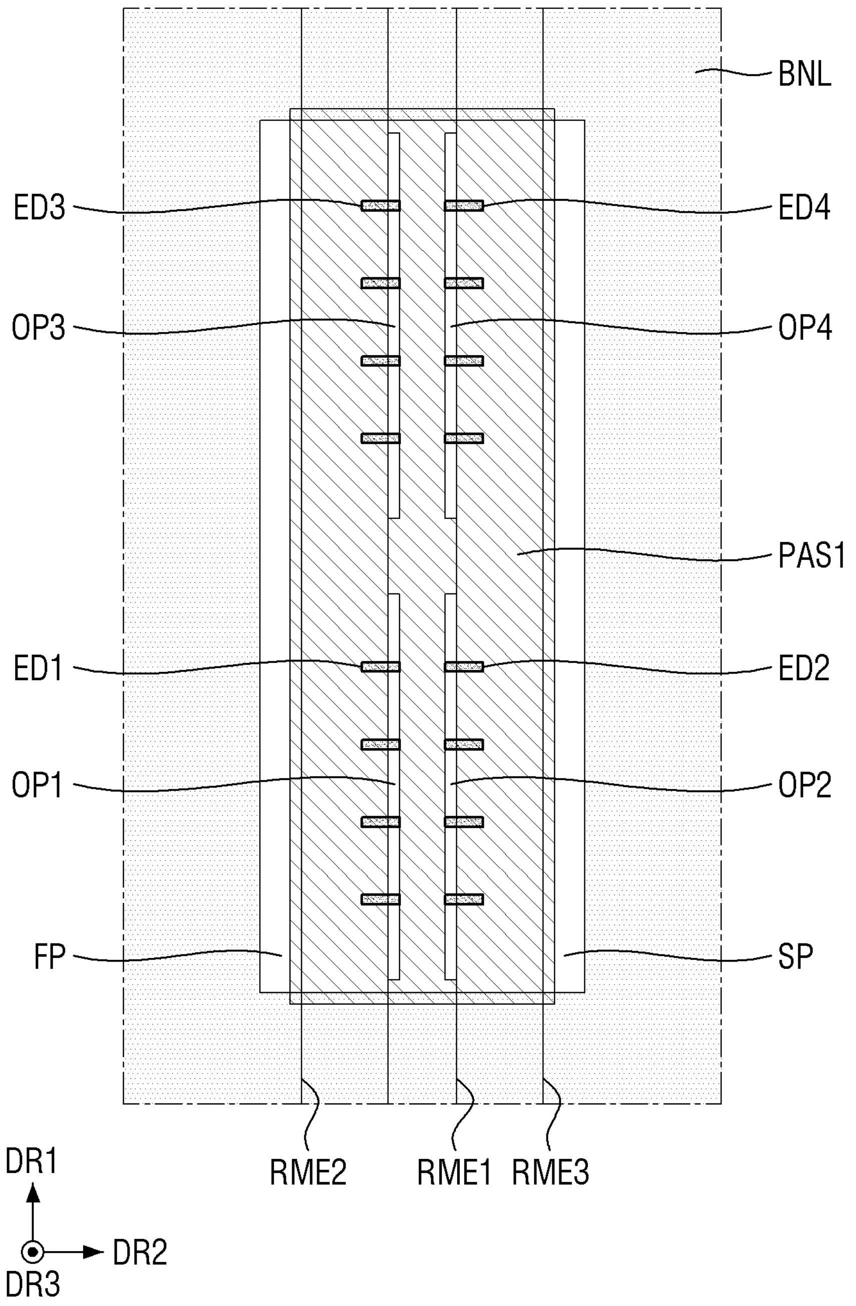
FIG. 7 is a plan view showing a first insulating layer and a bank layer of a first sub-pixel.
Figure 8:
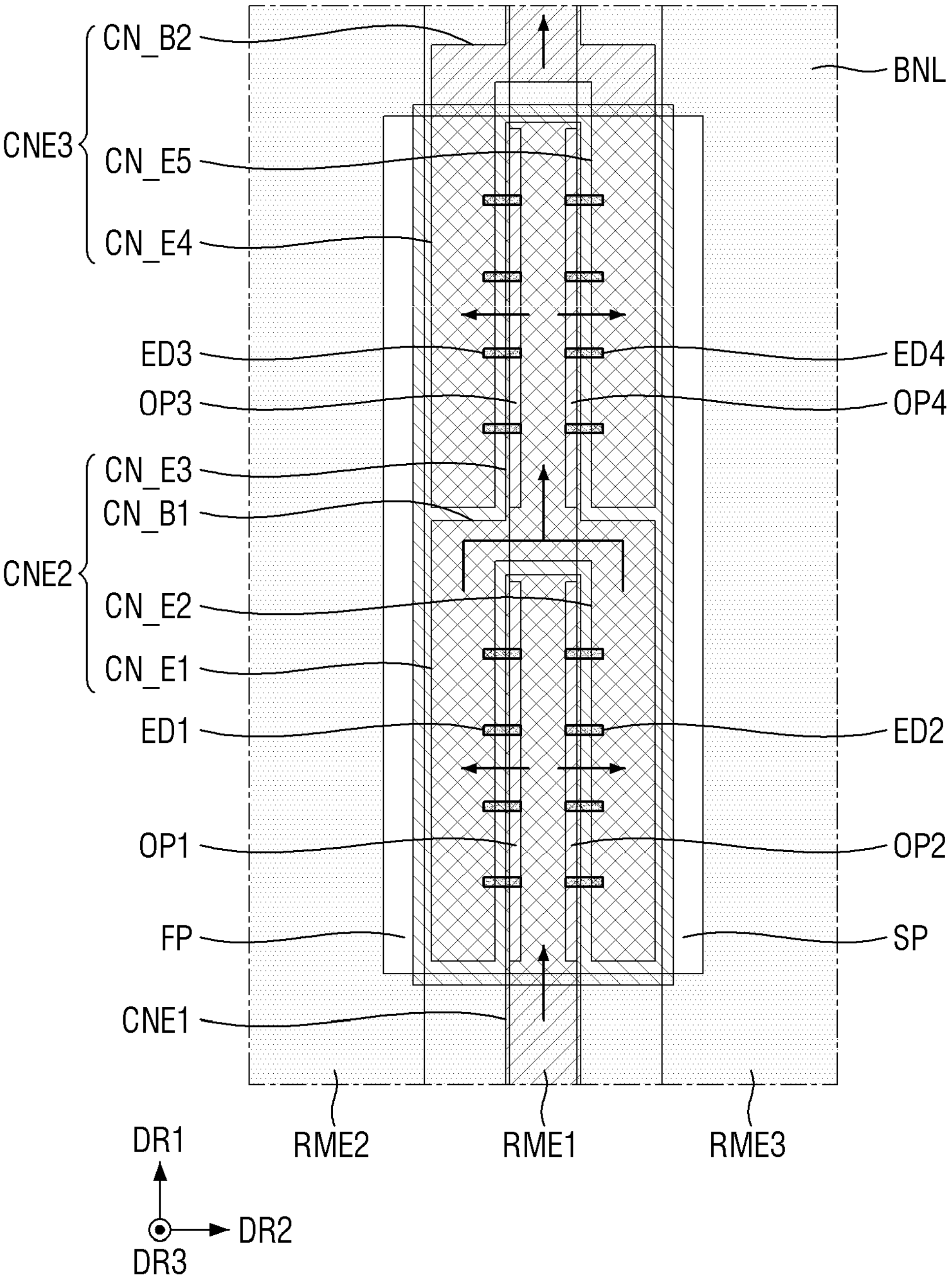
FIG. 8 is a view for illustrating current flows between connection electrodes and light-emitting elements of a first sub-pixel.
Figure 9:
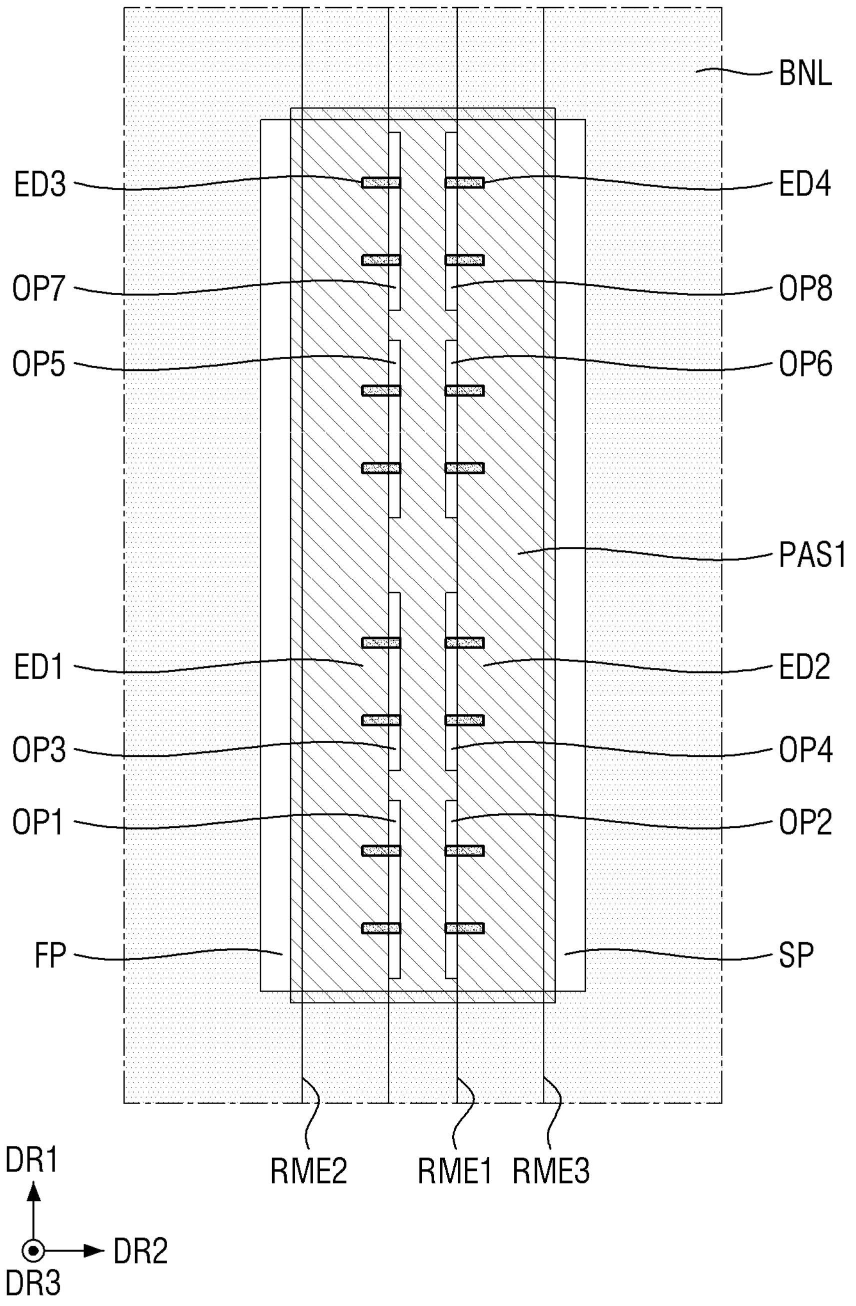
FIG. 9 is a plan view showing an example of a first insulating layer according to one or more embodiments.

FIG. 5 is a plan view showing the first sub-pixel of FIG. 4. FIG. 6 is a cross-sectional view taken along the line Q1-Q1' of FIG. 5. FIG. 7 is a plan view showing a first insulating layer and a bank layer of a first sub-pixel. FIG. 8 is a view for illustrating current flows between connection electrodes and light-emitting elements of a first sub-pixel. FIG. 9 is a plan view showing another example of a first insulating layer according to one or more embodiments.

Referring to FIGS. 5 to 8 in conjunction with FIG. 4, the display device 10 may include a substrate SUB, and a semiconductor layer, a plurality of conductive layers, and a plurality of insulating layers disposed thereon. In addition, the display device 10 may include a plurality of electrodes RME: RME1, RME2, and RME3, light-emitting elements ED, and connection electrodes CNE: CNE1, CNE2, and CNE3. The semiconductor layer, the conductive layers, and the insulating layers may form a circuit layer of the display device 10.

The substrate SUB may be an insulating substrate. The substrate SUB may be made of an insulating material such as glass, quartz, and a polymer resin. The substrate SUB may be either a rigid substrate or a flexible substrate that can be bent, folded, and/or rolled. The substrate SUB may include the display area DPA (see FIG. 1) and the non-display area NDA (see FIG. 1) around (e.g., surrounding) the display area DPA. The display area DPA may include the emission area EMA and the subsidiary area SA, which is a portion of the non-emission area.

A first conductive layer may be disposed on the substrate SUB. The first conductive layer includes a bottom metal layer CAS. The bottom metal layer CAS is disposed to overlap an active layer ACT of a first transistor T1 in a thickness direction of the substrate SUB (e.g., the third direction DR3). The bottom metal layer CAS may prevent light from being incident on the active layer ACT of the first transistor or may be electrically connected to the active layer ACT to stabilize the electrical characteristics of the first transistor T1. It is, however, to be noted that the bottom metal layer CAS may be eliminated.

A buffer layer BL may be disposed on the bottom metal layer CAS and the substrate SUB. The buffer layer BL may be formed on the substrate SUB to protect the transistors of the pixels PX from moisture permeating through the substrate SUB that is susceptible to moisture permeation, and may also provide a flat surface.

The semiconductor layer is disposed on the buffer layer BL. The semiconductor layer may include the active layer ACT of the first transistor T1. The active layer ACT may be disposed to partially overlap with a gate electrode G1 of a second conductive layer in the third direction DR3, which will be described later.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and/or indium-gallium zinc tin oxide (IGZTO), etc.

Although only one first transistor T1 is disposed in the sub-pixel SPXn of the display device 10 in the drawing, the present disclosure is not limited thereto. A larger number of transistors may be included in the display device 10.

A gate insulator GI is disposed on the semiconductor layer and the buffer layer BL in the display area DPA. The gate insulator GI may work as a gate insulating film of the first transistor T1. Although the gate insulator GI is disposed entirely on the buffer layer BL in the example shown in the drawings, the present disclosure is not limited thereto. In one or more embodiments, the gate insulator GI is patterned together with the gate electrodes G1 and G2 of the second conductive layer to be described later, and is partially disposed between the second conductive layer and the active layer ACT of the semiconductor layer.

The second conductive layer is disposed on the gate insulator GI. The second conductive layer may include a gate electrode G1 of the first transistor T1. The gate electrode G1 may be disposed so that it overlaps a channel region of the active layer ACT in the thickness direction, i.e., a third direction DR3. Although not shown in the drawings, the second conductive layer may further include an electrode of a storage capacitor.

An interlayer dielectric layer IL is disposed on the second conductive layer and the gate insulator GI. The interlayer dielectric layer IL may work as an insulating film between the second conductive layer and other layers disposed thereon and can protect the second conductive layer.

A third conductive layer is disposed on the interlayer dielectric layer IL. The third conductive layer may include the first voltage line VL1 and the second voltage line VL2 disposed in the display area DPA, a first conductive pattern CDP1, and a source electrode S1 and a drain electrode D1 of the first transistor T1. In one or more embodiments, the third conductive layer may further include the other electrode of the storage capacitor.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2 and the third electrode RME3. A portion of the first voltage line VL1 may be in contact with the active layer ACT of the first transistor T1 through a contact hole penetrating the interlayer dielectric film IL and the gate insulator GI. The first voltage line VL1 may work as the first drain electrode D1 of the first transistor T1. The second voltage line VL2 may be electrically connected to the second electrode RME2 and the third electrode RME3 to be described later.

The first conductive pattern CDP1 may be in contact with the active layer ACT of the first transistor T1 through a contact hole penetrating the interlayer dielectric layer IL and the gate insulator GI. The first conductive pattern CDP1 may be in contact with the bottom metal layer CAS through another contact hole penetrating the interlayer dielectric layer IL, the gate insulator GI, and the buffer layer BL. The first conductive pattern CDP1 may work as a source electrode S1 of the first transistor T1. In addition, the first conductive pattern CDP1 may be electrically connected to the first electrode RME1 or a first connection electrode CNE1 to be described later. The first transistor T1 may transfer the first supply voltage applied from the first voltage line VL1 to the first electrode RME1 or the first connection electrode CNE1.

A passivation layer PV is disposed on the third conductive layer and the interlayer dielectric layer IL. The passivation layer PV may work as an insulating film between the third conductive layer and other layers and can protect the third conductive layer.

The buffer layer BL, the gate insulator GI, the interlayer dielectric layer IL and the passivation layer PV may be made up of multiple inorganic layers stacked on one another alternately. For example, the buffer layer BL, the gate insulator GI, the interlayer dielectric layer IL, and the passivation layer PV may be made up of a double layer in which inorganic layers including at least one of silicon oxide (SiOx), silicon nitride (SiNx) and/or silicon oxynitride (SiON) are stacked on one another or multiple layers in which they are alternately stacked on one another. It is, however, to be understood that the present disclosure is not limited thereto. The buffer layer BL, the gate insulator GI, the interlayer dielectric layer IL, and the passivation layer PV may be made up of a single inorganic layer including the above-described insulating material. In addition, in one or more embodiments, the interlayer dielectric film IL may be made of an organic insulating material such as polyimide (PI).

A via layer VIA may be disposed on the passivation layer PV in the display area DPA. The via layer VIA may include an organic insulating material, e.g., an organic insulating material such as polyimide (PI), to provide a flat surface over the underlying conductive layers having different heights. It should be noted that the via layer VIA may be eliminated in some implementations.

The display device 10 may include the electrodes RME: RME1, RME2, and RME3, the bank layer BNL, the light-emitting elements ED, and the connection electrodes CNE: CNE1, CNE2, and CNE3 as a display element layer disposed on the via layer VIA. In addition, the display device 10 may include a plurality of insulating layers PAS1 and PAS2.

The plurality of electrodes RME may be disposed on the via layer VIA. The plurality of electrodes RME may have a shape extended in a direction and may be disposed in each of the sub-pixels SPXn. The plurality of electrodes RME may be extended in the first direction DR1 to be disposed across the emission area EMA and the subsidiary area SA of the sub-pixel SPXn, and they may be spaced from one another in the second direction DR2.

The display device 10 may include a first electrode RME1, a second electrode RME2, and a third electrode RME3 disposed on each of the sub-pixels SPXn. For example, the first electrode RME1 may be disposed at the center of the emission area EMA, the second electrode RME2 may be spaced from the first electrode RME1 in the opposite direction to the second direction DR2 and may be disposed on the left side of the center of the emission area EMA, and the third electrode RME3 may be spaced from the first electrode RME1 in the second direction DR2 and may be disposed on the right side of the center of the emission area EMA.

The first electrode RME1 may be disposed in each of the sub-pixels SPXn, while each of the second electrode RME2 and the third electrode RME3 may be disposed across other adjacent sub-pixels SPXn in the second direction DR2. A portion of the second electrode RME2 may be adjacent to the first electrode RME1, and another part thereof may be disposed in another sub-pixel SPXn spaced from the sub-pixel in the direction opposite to the second direction DR2. A portion of the third electrode RME3 may be disposed in another sub-pixel SPXn spaced from the sub-pixel in the second direction DR2, and another part thereof may be adjacent to the first electrode RME1.

In the emission area EMA of the first sub-pixel SPX1, the first electrode RME1, the second electrode RME2, and the third electrode RME3 may be disposed. Although the second electrode RME2 and the third electrode RME3 will be separately named and described for convenience of illustration, practically the second electrode RME2 and the third electrode RME3 are one electrode. For example, from the viewpoint of the another sub-pixel SPXn spaced from the sub-pixel SPXn in the second direction DR2, the third electrode RME3 may be the second electrode RME2.

The first electrode RME1, the second electrode RME2, and the third electrode RME3 may be connected through the electrode lines REL1 and REL2. For example, the first electrode RME1 may be extended to the upper side of the emission area EMA and may be connected to the first electrode line REL1. The first electrode RME1 and the first electrode line REL1 may be formed as one body (e.g., integrally formed). The first electrode line REL1 may be extended in the second direction DR2 so that a signal for aligning the light-emitting elements ED in the non-display area NDA of the display device 10 may be applied. In one or more embodiments, the first electrode line REL1 may be connected to the circuit layer of each pixel PX to apply an alignment signal.

Each of the second electrode RME2 and the third electrode RME3 may be extended to the lower side of the emission area EMA and may be connected to the second electrode line REL2. The second electrode RME2 and the third electrode RME3 may be formed as one body (e.g., integrally formed) with the second electrode line REL2. The second electrode line REL2 may be extended in the second direction DR2 so that a signal for aligning the light-emitting elements ED in the non-display area NDA of the display device 10 may be applied. In one or more embodiments, the second electrode line REL2 may be connected to the circuit layer of each pixel PX to apply an alignment signal.

In one or more embodiments, the first electrode RME1 may be separated in the subsidiary area SA on the upper side of the emission area EMA. The first electrode RME1 may be formed as a single electrode line extended to the first electrode line REL1, and then may be formed by separating the electrode line into parts in a subsequent process after the light-emitting elements ED have been disposed. That is to say, the first electrode RME1 and the first electrode line REL1 may be separated from each other. The first electrode line REL1 may be used to apply an alignment signal to the first electrode RME1 in order to align the light-emitting elements ED during the process of fabricating the display device 10. The process of separating the first electrode RME1 and the first electrode line REL1 from each other may be performed after the process of forming the second insulating layer PAS2.

Each of the electrodes RME may include a conductive material having a high reflectance. For example, the electrodes RME may include a metal such as silver (Ag), copper (Cu), and/or aluminum (Al) as the material having a high reflectance, and may be an alloy including aluminum (Al), nickel (Ni), and/or lanthanum (La), etc. The electrodes RME may reflect light that is emitted from the light-emitting elements ED and travels toward the side surfaces toward the upper side of each of the sub-pixels SPXn.

It is, however, to be understood that the present disclosure is not limited thereto. The electrodes RME may further include a transparent conductive material. For example, each of the electrodes RME may include a material such as ITO, IZO, and/or ITZO. In one or more embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, and/or ITO/Ag/ITZO/IZO.

The first insulating layer PAS1 may be disposed on each emission area EMA, and may be disposed on the via layer VIA and the plurality of electrodes RME. The first insulating layer PAS1 may insulate the different electrodes RME from one another and may provide space in which the light-emitting elements ED may be aligned. In addition, the first insulating layer PAS1 can also prevent that the light-emitting elements ED disposed thereon are brought into contact with other elements and damaged.

As shown in FIGS. 6 and 7, the first insulating layer PAS1 may be disposed in the emission area EMA of each of the sub-pixels SPXn, and may be formed in an island shape. The first insulating layer PAS1 may be disposed on the first electrode RME1, the second electrode RME2, and the third electrode RME3, and may also be disposed on the via layer VIA. Most of the area of the first insulating layer PAS1 may be disposed directly on the via layer VIA and may be in direct contact with the upper surface of the via layer VIA. A portion of the first insulating layer PAS1 may be disposed on the first electrode RME1, and another part may be disposed on the second electrode RME2, and the third electrode RME3.

The first insulating layer PAS1 may include a plurality of openings OP1, OP2, OP3, and OP4 exposing a portion of the first electrode RME1. The plurality of openings OP1, OP2, OP3 and OP4 may overlap with the first electrode RME1, may be extended in the first direction DR1, and may be spaced from each other in the first direction and/or the second direction DR2.

The plurality of openings OP1, OP2, OP3, and OP4 may include a first opening OP1, a second opening OP2, a third opening OP3, and a fourth opening OP4. The first opening OP1 may be located on the lower side in the emission area EMA and may be disposed on the left side of the center of the emission area EMA. The first opening OP1 may expose one side of the upper surface of the first electrode RME1, for example, a portion of the upper surface of the first electrode RME1 on the lower left side. The second opening OP2 may be spaced from the first opening OP1 in the second direction DR2 and may be arranged in parallel to the first opening OP1. The second opening OP1 may be located on the lower side in the emission area EMA and may be disposed on the left side of the center of the emission area EMA. The second opening OP2 may expose the opposite side of the upper surface of the first electrode RME1, for example, a portion of the upper surface of the first electrode RME1 on the lower right side. The first opening OP1 and the second opening OP2 may face each other and may have the same size.

The third opening OP3 may be spaced from the first opening OP1 in the first direction DR1 and may be extended in the same direction as the extending direction of the first opening OP1. The third opening OP3 may be located on the upper side in the emission area EMA and may be disposed on the left side of the center of the emission area EMA. The third opening OP3 may expose a portion of the upper surface of the first electrode RME1 on the upper left side. The fourth opening OP4 may be spaced from the second opening OP2 in the first direction DR1 and may be extended in the same direction as the extending direction of the second opening OP2. The fourth opening OP4 may be parallel to the third opening OP3 and may be spaced from the third opening OP3 in the second direction DR2. The fourth opening OP4 may be located on the upper side in the emission area EMA and may be disposed on the right side of the center of the emission area EMA. The fourth opening OP4 may expose a portion of the upper surface of the first electrode RME1 on the upper right side. The third opening OP3 and the fourth opening OP4 may have the same size. In one or more embodiments, the openings OP1, OP2, OP3, and OP4 may have the same size.

In the openings OP1, OP2, OP3, and OP4 described above, one ends of the light-emitting elements ED may be seated on the first electrode RME1 in a second alignment process of the light-emitting elements ED, which will be described later. For example, when a positive voltage is applied to the first electrode RME1, the negatively charged light-emitting elements ED may move to the top of the first electrode RME1 exposed by the openings OP1, OP2, OP3, and OP4. In other words, the light-emitting elements ED may be aligned and arranged in openings OP1, OP2, OP3, and OP4.

The first insulating layer PAS1 may be extended from the top of the first electrode RME1 in the second direction DR2 to cover edges of the second and third electrodes RME2 and RME3. The first insulating layer PAS1 may expose a portion of each of the second and third electrodes RME2 and RME3 in the emission area EMA without covering them. Such regions may be defined as regions between the first insulating layer PAS1 and the bank layer BNL, which will be described later. Specifically, the second electrode RME2 may include a first region FP that does not overlap with the bank layer BNL or the first insulating layer PAS1, and the third electrode RME3 may include a second region SP that does not overlap with the bank layer BNL or the first insulating layer PAS1. The first region FP and the second region SP may be extended in the first direction DR1 from the edges of the emission area EMA. For example, the first region FP may be disposed on the left side of the emission area EMA, and the second region SP may be disposed on the right side of the emission area EMA. The first region FP and the second region SP may be arranged parallel to each other, and may be spaced from each other in the second direction DR2 with the plurality of openings OP1, OP2, OP3, and OP4 therebetween. The widths of the first region FP and the second region SP in the second direction DR2 may be larger than the length of the light-emitting elements ED, so that all of the light-emitting elements ED are seated on the first region FP and the second region SP during the process of aligning the light-emitting elements ED. For example, the width of each of the first region FP and the second region SP in the second direction DR2 may be 5 μm or more.

In the first region FP and the second region SP, the light-emitting elements ED may be seated on the second electrode RME2 and the third electrode RME3 during a first alignment process of the light-emitting elements ED, which will be described later. For example, when a positive voltage is applied to each of the second electrode RME2 and the third electrode RME3, the negatively charged light-emitting elements ED may be moved to the top of the second electrode RME2 and third electrode RME3 exposed in the first region FP and the second region SP. In other words, in the first region FP and the second region SP, the light-emitting elements ED are aligned and arranged during the first alignment process.

The bank layer BNL may be disposed on the plurality of electrodes RME, the first insulating layer PAS1 and the via layer VIA. The bank layer BNL may include portions extended in the first direction DR1 and the second direction DR2 and may be around (e.g., may surround) each of the sub-pixels SPXn. The bank layer BNL may be around (e.g., may surround) the emission area EMA of each of the sub-pixels SPXn to distinguish the emission area EMA from the subsidiary area SA. The bank layer BNL may be disposed in the entire display area DPA to form a ladder-shaped pattern that is spaced from each other in the first direction DR1. The area opened by the bank layer BNL in the display area DPA may be the emission area EMA.

The bank layer BNL can prevent an ink from overflowing into adjacent sub-pixels SPXn during an inkjet printing process of the process of fabricating the display device 10. The bank layer BNL may include an organic insulating material such as polyimide.

The plurality of light-emitting elements ED may be disposed in the emission area EMA. The light-emitting elements ED may be disposed between the plurality of electrodes RME and spaced from each other in the second direction DR2. According to one or more embodiments of the present disclosure, the light-emitting elements ED may have a shape extended in one direction, and one end of each of the light-emitting elements ED may be disposed on the first electrodes RME1. The length of the light-emitting elements ED may be greater than the widths of the openings OP1, OP2, OP3, and OP4 of the first insulating layer PAS1. The direction in which the light-emitting elements ED are generally extended may be perpendicular to the first direction DR1 in which the electrodes RME are extended. It is, however, to be understood that the present disclosure is not limited thereto. The direction in which the light-emitting elements ED are extended may face the first direction DR1 or a direction obliquely thereto.

A plurality of light-emitting elements ED may be disposed on the first electrode RME1 and the first insulating layer PAS1. The light-emitting elements ED may overlap the first electrode RME1 and may be disposed on different openings OP1, OP2, OP3, and OP4 of the first insulating layer PAS1. The light-emitting elements ED may be in direct contact with the first electrode RME1 exposed through the plurality of openings OP1, OP2, OP3, and OP4.

According to one or more embodiments of the present disclosure, the light-emitting elements ED may include first light-emitting elements ED1 disposed on the lower left side in the emission area EMA; second light-emitting elements ED2 disposed on the lower right side in the emission area EMA; third light-emitting elements ED3 disposed on the upper left side in the emission area EMA; and fourth light-emitting elements ED4 disposed on the upper right side in the emission area EMA.

The first light-emitting elements ED1 may be disposed between the first electrode RME1 and the second electrode RME2 and may overlap the first opening OP1 of the first insulating layer PAS1 to be in contact with the first electrode RME1. The second light-emitting elements ED2 may be disposed between the first electrode RME1 and the third electrode RME3 and may overlap the second opening OP2 of the first insulating layer PAS1 to be in contact with the first electrode RME1. The third light-emitting elements ED3 may be disposed between the first electrode RME1 and the second electrode RME2 and may overlap the third opening OP3 of the first insulating layer PAS1 to be in contact with the first electrode RME1. The fourth light-emitting elements ED4 may be disposed between the first electrode RME1 and the third electrode RME3 and may overlap the fourth opening OP4 of the first insulating layer PAS1 to be in contact with the first electrode RME1. The first ends of the first light-emitting elements ED1 and the third light-emitting elements ED3 may overlap the first electrode RME1 but the second ends thereof may not overlap the first electrode RME1 and the second electrode RME2. The first ends of the second light-emitting elements ED2 and the fourth light-emitting elements ED4 may overlap the first electrode RME1 but the second ends thereof may not overlap the first electrode RME1 and the third electrode RME3.

The light-emitting elements ED may be spaced from each other with the first insulating layer PAS1 disposed on the first electrode RME1 therebetween. For example, the first light-emitting elements ED1 and the second light-emitting elements ED2 may be spaced from each other with the first insulating layer PAS1 between the first opening OP1 and the second opening OP2. In addition, the third light-emitting elements ED3 and the fourth light-emitting elements ED4 may be spaced from each other with the first insulating layer PAS1 disposed between the third opening OP3 and the fourth opening OP4 therebetween.

Each of the light-emitting elements ED may be in direct contact with a side surface of the first insulating layer PAS1 disposed between the openings OP1 and OP2, and between the openings OP3 and OP4. For example, the first ends of the first light-emitting elements ED1 may be in contact with one side surface of the first insulating layer PAS1 disposed on the first electrode RME1, and the first ends of the second light-emitting element ED2 may be in contact with the opposite surface of the first insulating layer PAS1 disposed on the first electrode RME1. For example, the first ends of the third light-emitting elements ED3 may be in contact with one side surface of the first insulating layer PAS1 disposed on the first electrode RME1, and the first ends of the fourth light-emitting element ED4 may be in contact with the opposite surface of the first insulating layer PAS1 disposed on the first electrode RME1.

It is to be noted that the light-emitting elements ED may not be sorted by their positions in the emission area EMA but may be sorted by connection relationships with the connection electrodes CNE, which will be described later. The both ends of the light-emitting elements ED may be in contact with different connection electrodes CNE depending on the arrangement structure of the connection electrodes CNE, and may be sorted into different light-emitting elements ED depending on the types of the connection electrodes CNE which they are in contact with.

The light-emitting elements ED may be in contact with the connection electrodes CNE so that they may be electrically connected thereto. As a portion of the semiconductor layer of each of the light-emitting elements ED is exposed at the end surface on one side of the direction in which they are extended, the exposed portion of the semiconductor layer may be in contact with the connection electrodes CNE. The first ends of the first light-emitting elements ED1 may be in contact with the first connection electrode CNE1 while the second ends thereof may be in contact with a portion of the second connection electrode CNE2 (a first extended portion CN_E1). The first ends of the second light-emitting elements ED2 may be in contact with the first connection electrode CNE1 while the second ends thereof may be in contact with another portion of the second connection electrode CNE2 (a second extended portion CN_E2). The first ends of the third light-emitting elements ED3 may be in contact with still another portion of the second connection electrode CNE2 (a third extended portion CN_E3) while the second ends thereof may be in contact with a portion of the third connection electrode CNE3 (a fourth extended portion CN_E4). The first ends of the fourth light-emitting elements ED4 may be in contact with still another portion of the second connection electrode CNE2 (the third extended portion CN_E3) while the second ends thereof may be in contact with another portion of the third connection electrode CNE3 (a fifth extended portion CN_E5). Each of the light-emitting elements ED may be electrically connected to the conductive layers under the via layer VIA through the connection electrodes CNE, and an electric signal may be applied to it so that light of a particular wavelength range can be emitted. The light-emitting elements ED may be in direct contact with the first electrode RME1 exposed through the plurality of openings OP1, OP2, OP3, and OP4. Because the first electrode RME1 is separated into parts after the alignment process of the light-emitting elements ED as described above, the first electrode RME1 becomes floating and is not involved in light emission of the light-emitting elements ED.

The light-emitting elements ED may be extended in a direction, and the direction may be parallel to the upper surface of the substrate SUB. As will be described later, the light-emitting elements ED may include a plurality of semiconductor layers arranged in the extended direction. The plurality of semiconductor layers may be sequentially arranged along a direction parallel to the upper surface of the substrate SUB. It should be understood, however, that the present disclosure is not limited thereto. When the light-emitting elements ED have a different structure, a plurality of semiconductor layers may be disposed in a direction perpendicular to the substrate SUB.

The light-emitting elements ED disposed in each of the sub-pixels SPXn may emit light of different wavelength bands depending on the material of the semiconductor layer. It is, however, to be understood that the present disclosure is not limited thereto. The light-emitting elements ED disposed in each of the sub-pixels SPXn may include the semiconductor layers made of the same material and may emit light of the same color.

The light-emitting elements ED may be electrically connected to the electrodes RME and the conductive layers under the via layer VIA in contact with the connection electrodes CNE: CNE1, CNE2, and CNE3, and an electric signal may be applied to it so that light of a particular wavelength range can be emitted.

The second insulating layer PAS2 may be disposed on the light-emitting elements ED, the first insulating layer PAS1, and the first electrode RME1. The second insulating layer PAS2 may be extended in the first direction DR1. The second insulating layer PAS2 may be disposed to partially cover the outer surface of the light-emitting elements ED, and may not cover both sides or both ends of the light-emitting elements ED. The second insulating layer PAS2 may form a linear or island pattern in each sub-pixel SPXn when viewed from the top. The second insulating layer PAS2 may include a plurality of patterns. For example, the second insulating layer PAS2 may include a first pattern extended in the first direction DR1 to cover the first light-emitting elements ED1 and the third light-emitting elements ED3, and a second pattern extended in the first direction DR1 to cover the second light-emitting elements ED2 and the fourth light-emitting elements ED4. The first pattern and the second pattern may be arranged parallel to each other and may be spaced from each other in the second direction DR2. The second insulating layer PAS2 can protect the light-emitting elements ED and fix the light-emitting elements ED during the process of fabricating the display device 10.

The plurality of connection electrodes CNE1, CNE2, and CNE3 may include a first connection electrode CNE1 that is a first-type connection electrode, and a second connection electrode CNE2 and a third connection electrode CNE3 that are second-type connection electrodes.

The first connection electrode CNE1 may have a shape extended in the first direction DR1 and may be disposed on the first electrode RME1 in the emission area EMA. The first connection electrode CNE1 may overlap the first electrode RME1 and may be extended in the first direction DR1 from it to be disposed in the subsidiary area SA located on the lower side of the emission area EMA beyond the bank layer BNL. The first connection electrode CNE1 may cross and overlap the bank layer BNL located on the lower side of the emission area EMA. The first connection electrode CNE1 may be electrically connected to the first conductive pattern CDP1 through a first contact CT1 in the subsidiary area SA. The first connection electrode CNE1 may overlap the first opening OP1 and the second opening OP2 of the first insulating layer PAS1.

The second connection electrode CNE2 may overlap the first electrode RME1. Specifically, the second connection electrode CNE2 may include first to third extended portions CN_E1, CN_E2, and CN_E3 extended in the first direction DR1, and a first bridge portion CN_B1 connecting between the first to third extended portions CN_E1, CN_E2, and CN_E3. The first extended portion CN_E1 and the second extended portion CN_E2 may be spaced from each other with the first electrode RME1 therebetween in the emission area EMA. The first extended portion CN_E1 and the second extended portion CN_E2 may be opposed to each other and may be arranged in parallel. The third extended portion CN_E3 may be disposed on the first electrode RME1 such that it overlaps the first electrode RME1 in the emission area EMA. The first bridge portion CN_B1 may be extended in the second direction DR2 crossing the first electrode RME1 in the emission area EMA, and may connect between the first extended portion CN_E1, the second extended portion CN_E2 and the third extended portion CN_E3.

The first extended portion CN_E1, the second extended portion CN_E2, and the first bridge portion CN_B1 may be disposed to be around (e.g., to surround) the first connection electrode CNE1 when viewed from the top. The first extended portion CN_E1 may not overlap the first opening OP1 of the first insulating layer PAS1, and the second extended portion CN_E2 may not overlap the second opening OP2 of the first insulating layer PAS1.

The second connection electrode CNE2 may be in a floating state that is not connected to other lines or electrodes. The second connection electrode CNE2 may transmit a signal applied through the light-emitting elements ED. The first to fourth light-emitting elements ED1, ED2, ED3, and ED4 may be connected in series only through the second connection electrode CNE2.

The third connection electrode CNE3 may be disposed such that it does not overlap the first electrode RME1 in the emission area EMA. Specifically, the third connection electrode CNE3 may include fourth and fifth extended portions CN_E4 and CN_E5 extended in the first direction DR1, and a second bridge portion CN_B2 connecting between the fourth and fifth extended portions CN_E4 and CN_E5. The fourth extended portion CN_E4 and the fifth extended portion CN_E5 may be spaced from each other with the first electrode RME1 therebetween in the emission area EMA. The fourth extended portion CN_E4 and the fifth extended portion CN_E5 may be opposed to each other and may be arranged in parallel. The second bridge portion CN_B2 may be extended in the second direction DR2 crossing the first electrode RME1, and may connect between the fourth extended portion CN_E4 and the fifth extended portion CN_E5.

The fourth extended portion CN_E4, the fifth extended portion CN_E5, and the second bridge portion CN_B2 may be disposed to be around (e.g., to surround) the third extended portion CN_E3 of the second connection electrode CNE2 when viewed from the top. The fourth extended portion CN_E4 may not overlap the third opening OP3 of the first insulating layer PAS1, and the fifth extended portion CN_E5 may not overlap the fourth opening OP4 of the first insulating layer PAS1.

The third connection electrode CNE3 may be extended in the first direction DR1 to be disposed in the subsidiary area SA located on the upper side of the emission area EMA beyond the bank layer BNL. The third connection electrode CNE3 may cross and overlap the bank layer BNL located on the upper side of the emission area EMA. The third connection electrode CNE3 may be electrically connected to the second voltage line VL2 through a second contact CT2 (see FIG. 4) in the subsidiary area SA.

According to one or more embodiments of the present disclosure, the first connection electrode CNE1 may be electrically connected to the first transistor T1 to apply the first supply voltage through the first contact CT1, and the third connection electrode CNE3 may be electrically connected to the second voltage line VL2 to apply the second supply voltage through the second contact CT2. Each of the connection electrodes CNE may be in contact with the light-emitting elements ED in the emission area EMA to transmit the supply voltage to the light-emitting elements ED.

The connection electrodes CNE may include a conductive material. For example, the connection electrodes CNE may include ITO, IZO, ITZO, aluminum (Al), etc. For example, the connection electrodes CNE may include a transparent conductive material, and lights emitted from the light-emitting elements ED may be transmitted through the connection electrodes CNE to exit.

In one or more embodiments, another insulating layer may be further disposed on the bank layer BNL, the first insulating layer PAS1, the second insulating layer PAS2, the connection electrodes CNE, and the electrodes RME. The insulating layer can protect the elements disposed on the substrate SUB against the external environment.

Each of the first insulating layer PAS1 and the second insulating layer PAS2 may include an inorganic insulating material or an organic insulating material. For example, each of the first insulating layer PAS1 and the second insulating layer PAS2 may include an inorganic insulating material or an organic insulating material. Either both or one of the first insulating layer PAS1 and the second insulating layer PAS2 may be formed in a structure in which insulating layers are alternately or repeatedly stacked on one another. According to one or more embodiments of the present disclosure, each of the first insulating layer PAS1 and the second insulating layer PAS2 may include one of silicon oxide (SiOx), silicon nitride (SiNx), and/or silicon oxynitride (SiOxNy). The first insulating layer PAS1 and the second insulating layer PAS2 may be made of the same material. Alternatively, some of them may include the same material while the other(s) may include different material(s), or they may include different materials.

As shown in FIG. 8, the first ends of the first light-emitting elements ED1 and the second light-emitting elements ED2 may be in contact with the first-type connection electrodes (e.g., CNE1), while the second ends thereof may be in contact with the second-type connection electrodes (e.g., CNE2). The first light-emitting elements ED1 may be in contact with the first connection electrode CNE1 and the first extended portion CN_E1 of the second connection electrode CNE2, and the second light-emitting elements ED2 may be in contact with the first connection electrode CNE1 and the second extended portion CN_E2 of the second connection electrode CNE2. The first and second ends of the third light-emitting elements ED3 and the fourth light-emitting elements ED4 may be in contact with the second-type connection electrodes. The third light-emitting elements ED3 may be in contact with the third extended portion CN_E3 of the second connection electrode CNE2 and the fourth extended portion CN_E4 of the third connection electrode CNE3, and the fourth light-emitting elements ED4 may be in contact with the third extended portion CN_E3 of the second connection electrode CNE2 and the fifth extended portion CN_E5 of the third connection electrode CNE3.

The plurality of light-emitting elements ED may be connected in series to each other through the plurality of connection electrodes CNE. For example, the electric current applied through the first connection electrode CNE1 may flow to the second connection electrode CNE2 through the first light-emitting elements ED1 and the second light-emitting elements ED2. The current applied to the second connection electrode CNE2 may flow to the third connection electrode CNE3 through the third light-emitting elements ED3 and the fourth light-emitting elements ED4, so that each of the light-emitting elements ED can emit light. According to the present embodiment, the display device 10 includes a greater number of light-emitting elements ED for each of the sub-pixels SPXn to form the serial connection, thereby further increasing the amount of emitted light per unit area.

Incidentally, as shown in FIG. 9, the first insulating layer PAS1 may include a greater number of openings than FIG. 7. For example, the first insulating layer PAS1 may include first to eighth openings OP1, OP2, OP3, OP4, OP5, OP6, OP7, and OP8. The first opening OP1 and the second opening OP2 may be located on the lowermost side in the emission area EMA, and the first opening OP1 may be located on the left side of the center of the emission area EMA and the second opening OP2 may be located on the right side of the center of the emission area EMA. The third opening OP3 and the fourth opening OP4 may be located on the upper side of the first opening OP1 and the second opening OP2 and may be located on the lower side of the center of the emission area EMA. The third opening OP3 may be located on the left side of the center of the emission area EMA, and the fourth opening OP4 may be located on the right side of the center of the emission area EMA. The fifth opening OP5 and the sixth opening OP6 may be located on the upper side of the third opening OP3 and fourth opening OP4 and may be located on the upper side of the center of the emission area EMA. The fifth opening OP5 may be located on the left side of the center of the emission area EMA, and the sixth opening OP6 may be located on the right side of the center of the emission area EMA. The seventh opening OP7 and the eighth opening OP8 may be located on the upper side of the fifth opening OP5 and the sixth opening OP6 and may be located on the uppermost side in the emission area EMA. The seventh opening OP7 may be located on the left side of the center of the emission area EMA, and the eighth opening OP8 may be located on the right side of the center of the emission area EMA.

As the first insulating layer PAS1 includes more openings OP1, OP2, OP3, OP4, OP5, OP6, OP7, and OP8, the positions at which the light-emitting elements ED are aligned can be more precisely controlled.

As described above, in the display device 10 according to the present embodiment, a plurality of openings exposing the first electrode RME1 is disposed in the first insulating layer PAS1, so that the positions where the light-emitting elements ED are finally aligned can be controlled and alignment degree of the light-emitting elements ED can be improved.

Figure 10:
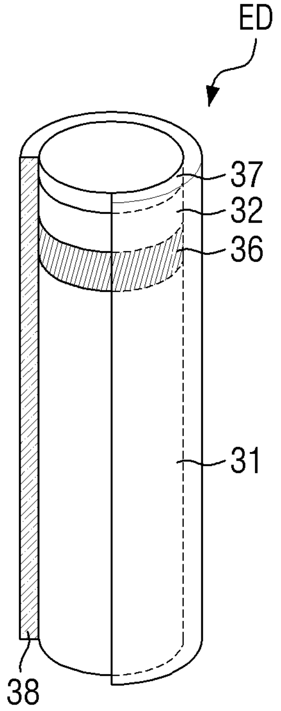
FIG. 10 is a cutaway view showing a light-emitting element according to one or more embodiments of the present disclosure.

FIG. 10 is a cutaway view showing a light-emitting element according to one or more embodiments of the present disclosure.

Referring to FIG. 10, a light-emitting element ED may be a light-emitting diode. Specifically, the light-emitting element ED may have a size from nanometers to micrometers and may be an inorganic light-emitting diode made of an inorganic material. The light-emitting element ED may be aligned between two electrodes facing each other as polarities are created by forming an electric field in a particular direction between the two electrodes.

The light-emitting element ED according to one or more embodiments may have a shape extended in one direction. The light-emitting element ED may have a shape of a cylinder, a rod, a wire, a tube, etc. It is to be understood that the shape of the light-emitting element ED is not limited thereto. The light-emitting element ED may have a variety of shapes including a polygonal column shape such as a cube, a cuboid and a hexagonal column, or a shape that is extended in a direction with partially inclined outer surfaces.

The light-emitting element ED may include semiconductor layers doped with a dopant of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be one or more of AlGaInN, GaN, AlGaN, InGaN, AlN and InN doped with n-type dopant. The n-type dopant doped into the first semiconductor layer 31 may be Si, Ge, Se, Sn, etc.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of AlGaInN, GaN, AlGaN, InGaN, AlN, and/or InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a signal layer in the drawings, the present disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be one or more of AlGaInN, GaN, AlGaN, InGaN, AlN, and/or InN doped with an n-type dopant. The semiconductor layer disposed between the second semiconductor layer 32 and the emissive layer 36 may be one or more of AlGaInN, GaN, AlGaN, InGaN, AlN, and/or InN doped with a p-type dopant.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and/or InGaN. In particular, when the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked on one another, and may include other Group Ill to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode and may be on the second semiconductor layer 32 (and/or the first semiconductor layer 31). It is, however, to be understood that the present disclosure is not limited thereto. The electrode layer 37 may be a Schottky connection electrode. The light-emitting element ED may include at least one electrode layer 37. The light-emitting element ED may include one or more electrode layers 37. It is, however, to be understood that the present disclosure is not limited thereto. The electrode layer 37 may be eliminated.

The electrode layer 37 can reduce the resistance between the light-emitting element ED and the electrodes or the connection electrodes when the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO, and/or ITZO.

The insulating film 38 is disposed to be around (e.g., to surround) the outer surfaces (e.g., the outer peripheral or circumferential surfaces) of the plurality of semiconductor layers and electrode layers described above. For example, the insulating film 38 may be disposed to be around (e.g., to surround) at least the outer surface (e.g., the outer peripheral or circumferential surface) of the emissive layer 36, with both ends of the light-emitting element ED in the longitudinal direction exposed. In addition, a portion of the upper surface of the insulating film 38 may be rounded in cross section, which is adjacent to at least one of the ends of the light-emitting element ED.

The insulating film 38 may include materials having insulating properties, for example, at least one of: silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx). Although the insulating film 38 is formed as a single layer in the drawings, the present disclosure is not limited thereto. In one or more embodiments, the insulating film 38 may include a multilayer structure in which multiple layers are stacked on one another.

The insulating film 38 can protect the semiconductor layers and the electrode layer of the light-emitting elements ED. The insulating film 30 can prevent an electrical short-circuit that may occur in the emissive layer 36 if it comes in direct contact with an electrode through which an electric signal is transmitted to the light-emitting diode ED. In addition, the insulating film 38 can prevent a decrease in luminous efficiency.

In addition, the outer surface (e.g., the outer peripheral or circumferential surface) of the insulating film 38 may be subjected to surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting elements ED dispersed in the ink from being aggregated with one another.

FIGS. 11-19 are plan views showing processing steps of a method of fabricating a display device according to one or more embodiments of the present disclosure. FIGS. 11-19 illustrate processes to form the electrodes RME to the connection electrodes CNE of the display device 10. Each of the layers may be formed by typical patterning process and inkjet printing process. Hereinafter, the alignment process of the first insulating layer PAS1 and the light-emitting elements ED will be mainly described, and other elements will be briefly described.

Figure 11:
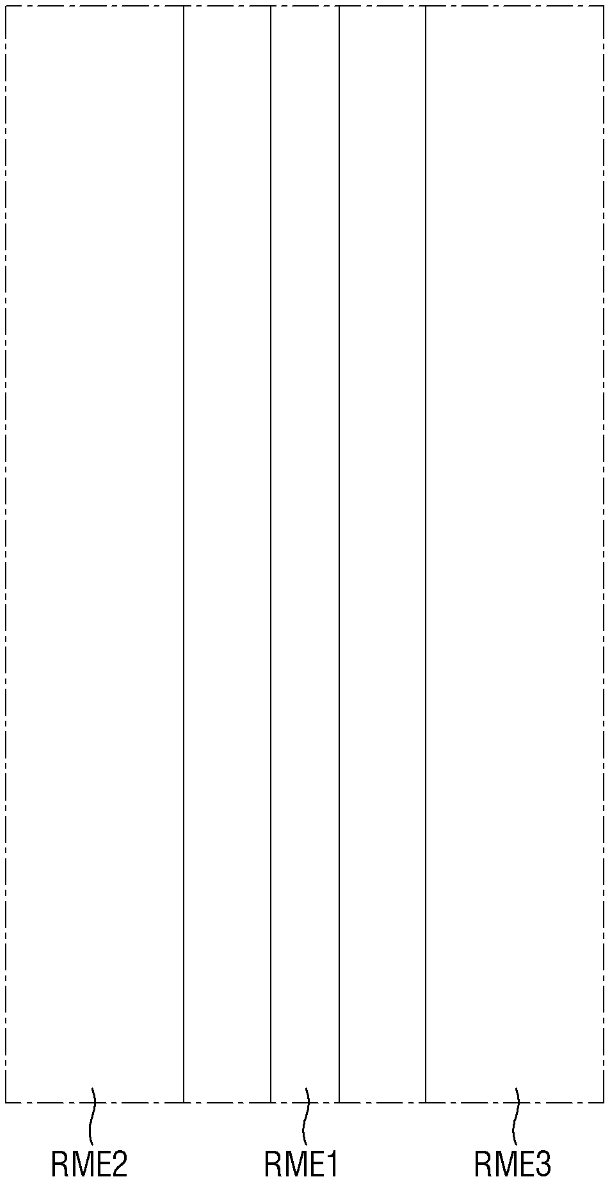
FIGS. 11-19 are plan views showing processing steps of a method of fabricating a display device according to one or more embodiments of the present disclosure.

Referring to FIG. 11, first to third electrodes RME1, RME2, and RME3 are formed on a via layer. The first to third electrodes RME1, RME2, and RME3 may be formed by depositing a conductive material over a via layer formed on a substrate and patterning it.

Figure 12:
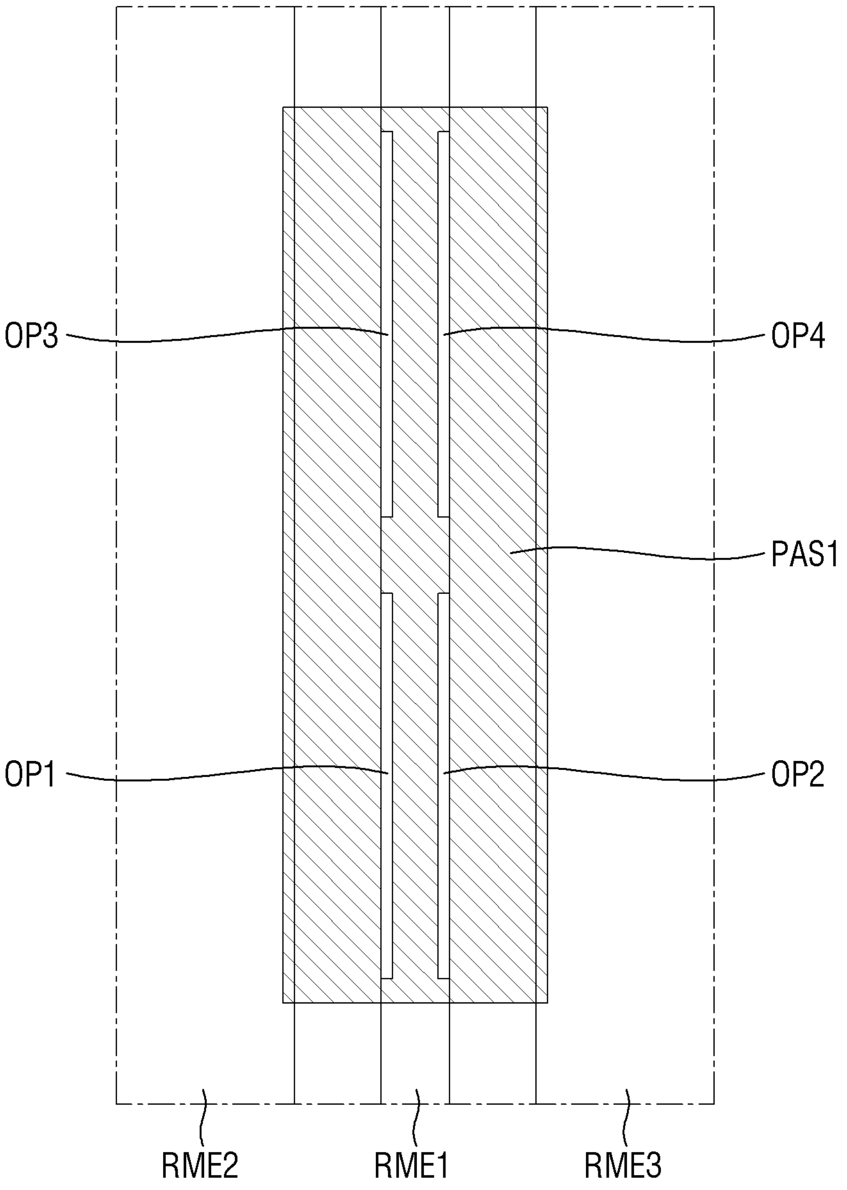

Subsequently, referring to FIG. 12, a first insulating layer PAS1 is formed on the first to third electrodes RME1, RME2, and RME3. The first insulating layer PAS1 may be formed by depositing an inorganic insulating material and then patterning it. The first insulating layer PAS1 may have first to fourth openings OP1, OP2, OP3, and OP4 exposing parts of the first electrode RME1. The arrangement of the first to fourth openings OP1, OP2, OP3 and OP4 has been described above; and, therefore, the redundant descriptions will be omitted. In addition, the first insulating layer PAS1 may be formed to cover one side of each of the second and third electrodes RME2 and RME3.

Figure 13:
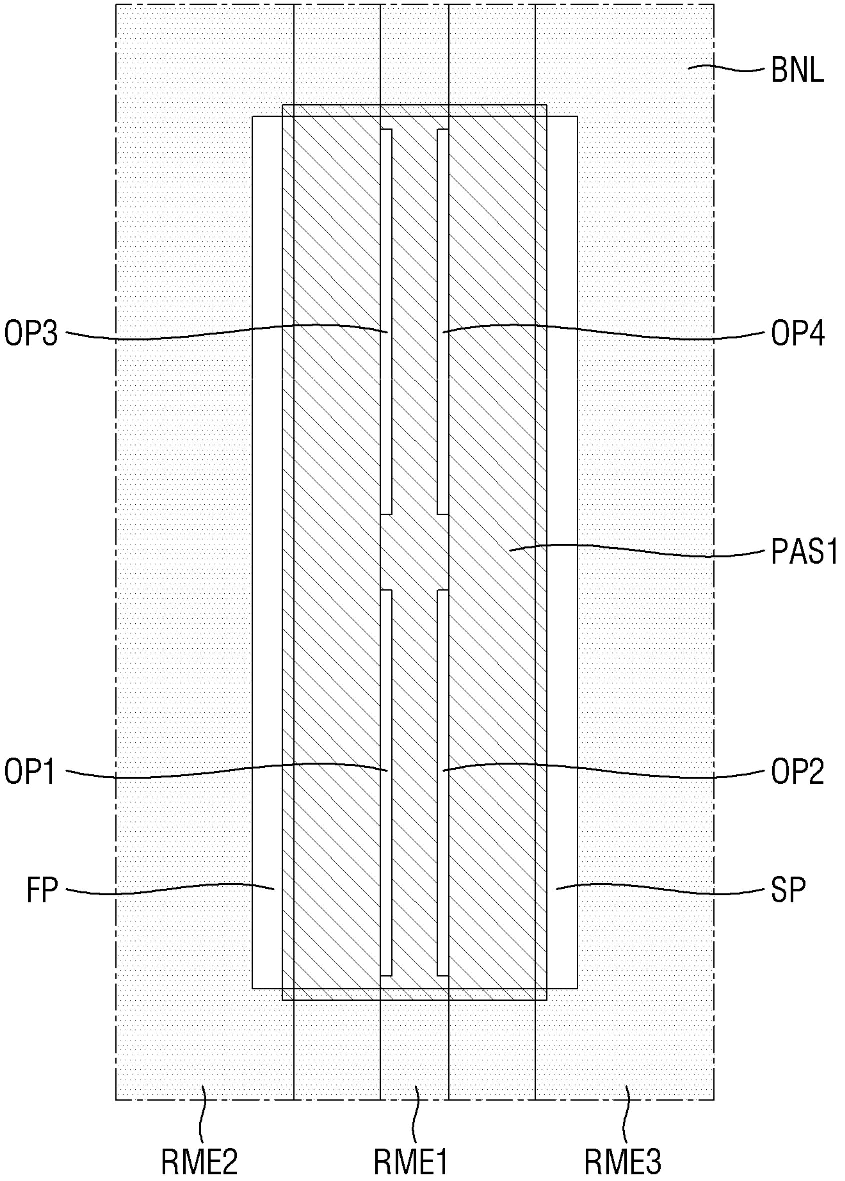

Subsequently, referring to FIG. 13, a bank material is applied on the via layer, the first insulating layer PAS1, and the first to third electrodes RME1, RME2, and RME3, and then is patterned to form a bank layer BNL. The bank material may be applied by a solution process such as inkjet printing, screen printing, and/or spin coating. The bank layer BNL is formed to be around (e.g., to surround) the first insulating layer PAS1 and may partition emission areas and subsidiary areas. The bank layer BNL may cover the upper and lower sides of the first insulating layer PAS1 but may not cover the left and right sides of the first insulating layer PAS1 so that they are spaced from each other. A first region FP exposing the second electrode RME2 thereunder may be formed between the first insulating layer PAS1 and the bank layer BNL on the left side of the first insulating layer PAS1. A second region SP exposing the third electrode RME3 thereunder may be formed between the first insulating layer PAS1 and the bank layer BNL on the right side of the first insulating layer PAS1.

Figure 14:
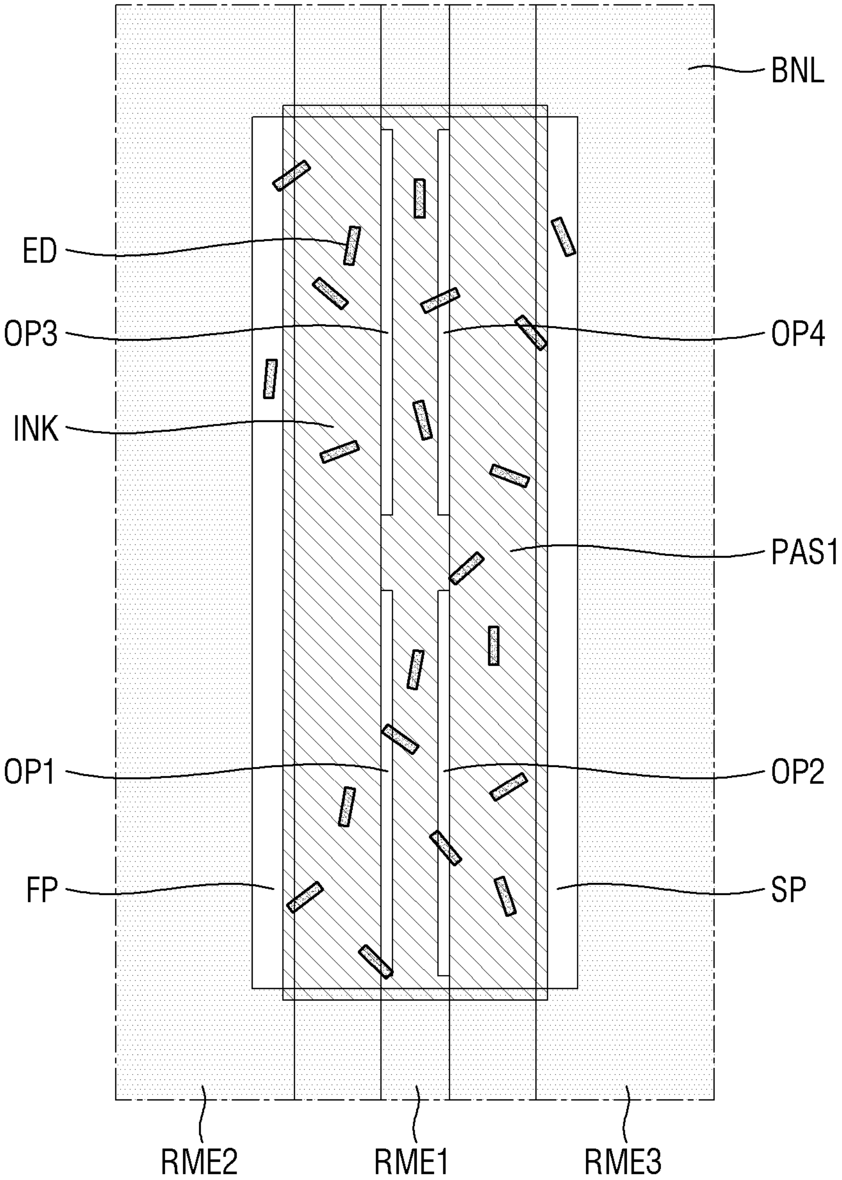

Subsequently, referring to FIG. 14, the ink INK containing light-emitting elements ED is sprayed onto the first insulating layer PAS1 partitioned by the bank layer BNL. The ink INK may include a plurality of light-emitting elements ED dispersed in a solvent. The light-emitting elements ED may be uniformly dispersed in a solvent.

The ink INK may be sprayed onto the first insulating layer PAS1 via a printing process using an inkjet printing device. The droplets of the ink INK may be ejected through a nozzle of an inkjet head included in the inkjet printing device. The ink INK ejected from the nozzle may be sprayed onto the first insulating layer PAS1 on which the first electrode RME1, the second electrode RME2 and the third electrode RME3 are formed. The light-emitting elements ED may have a shape extended in a direction, and may be dispersed in the ink INK as they are randomly oriented. Once the ink INK is sprayed on the first insulating layer PAS1, the ink INK may be applied within the region partitioned by the bank layer BNL without flowing over the bank layer BNL.

Figure 15:
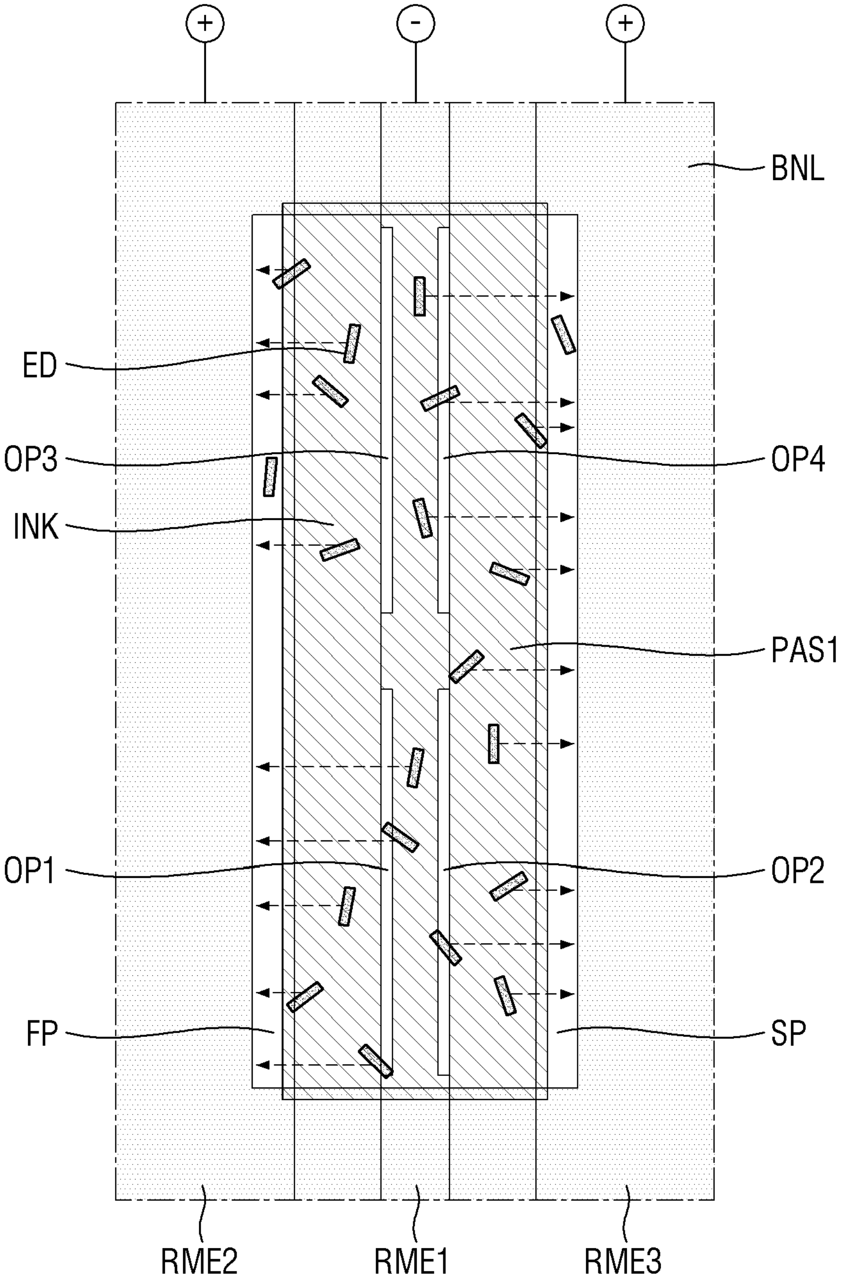
Figure 16:
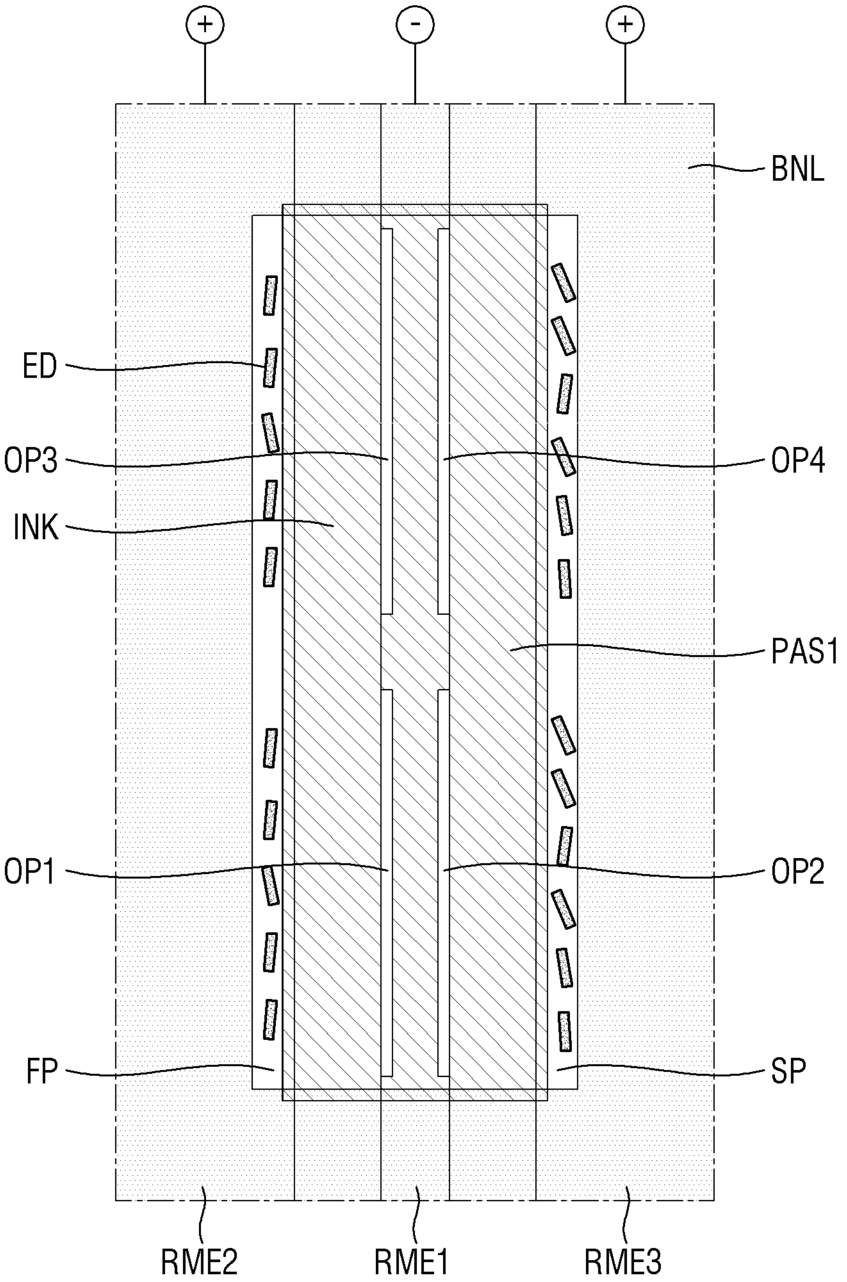

Subsequently, referring to FIGS. 15 and 16, a first alignment process of aligning the light-emitting elements ED on the second and third electrodes RME2 and RME3 is performed. Specifically, the first alignment signal is applied to the first to third electrodes RME1, RME2, and RME3. For example, a negative voltage is applied to the first electrode RME1, and a positive voltage is applied to the second and third electrodes RME2 and RME3. Because the surface of the insulating film 38 (see FIG. 10) of the light-emitting elements ED is negatively charged, they move from the first electrode RME1 to which the negative voltage is applied, to the second electrode RME2 and the third electrode RME3 to which the positive voltage is applied. As a result, as shown in FIG. 16, the light-emitting elements ED may be aligned and arranged on the first region FP of the second electrode RME2 and the second region SP of the third electrode RME3.

Figure 17:
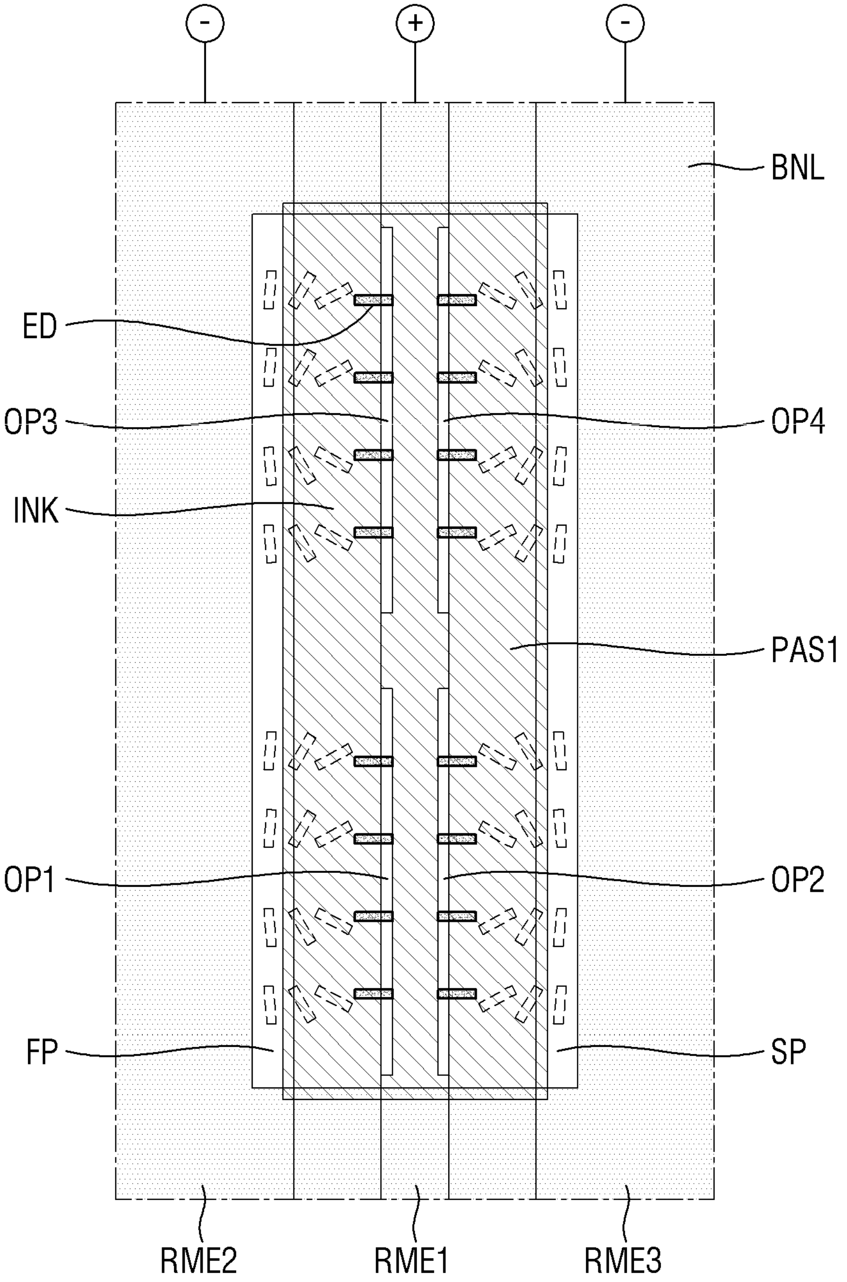
Figure 18:
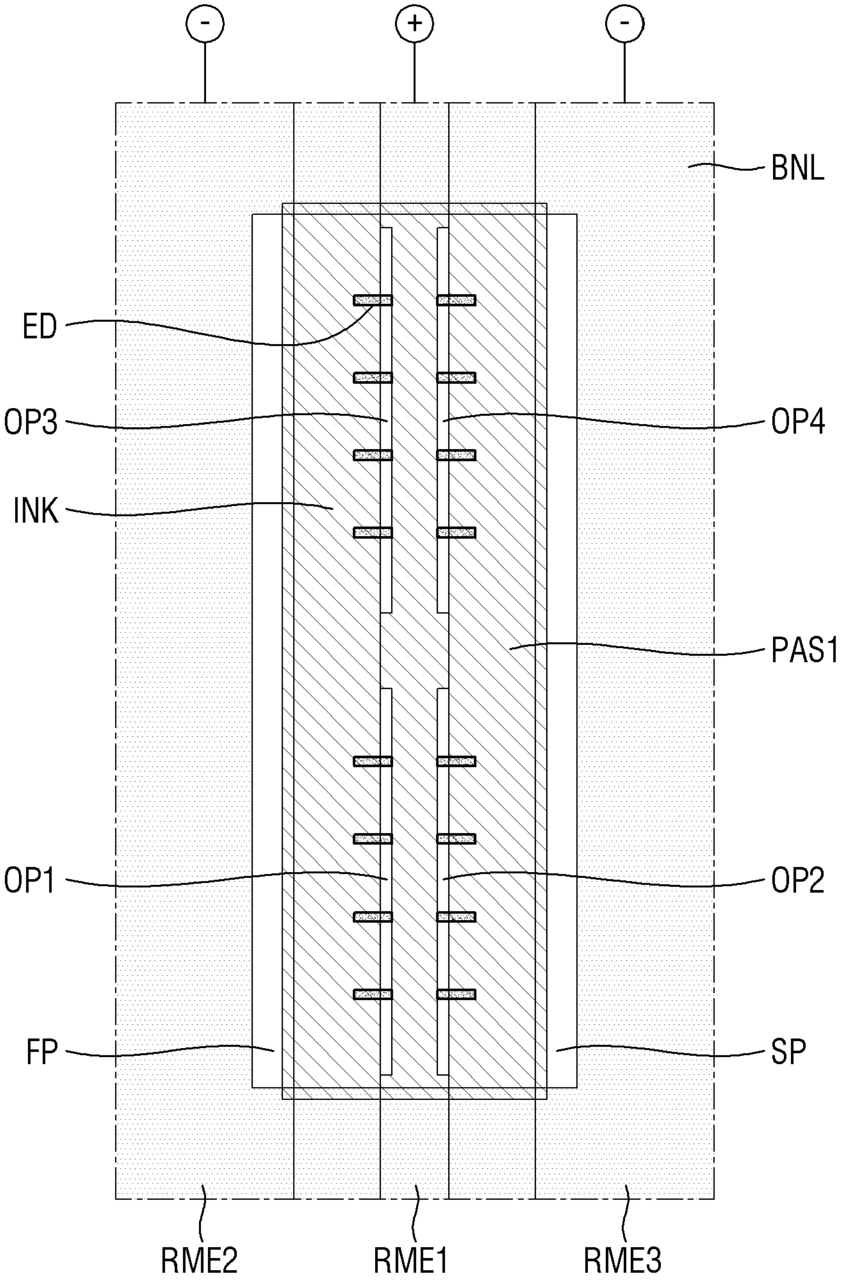

Subsequently, referring to FIGS. 17 and 18, a second alignment process of aligning the light-emitting elements ED on the first electrode RME1 is performed. Specifically, alignment signals are applied to the first to third electrodes RME1, RME2, and RME3. In the second alignment process, an alignment signal opposite to that of the first alignment process may be applied. For example, a positive voltage is applied to the first electrode RME1, while a negative voltage is applied to the second and third electrodes RME2 and RME3. Because the surface of the insulating film 38 (see FIG. 10) of the light-emitting elements ED is negatively charged, they move from the second electrode RME2 and the third electrode RME3 to which the negative voltage is applied, to the first electrode RME1 to which the positive voltage is applied. Accordingly, as shown in FIG. 18, the light-emitting elements ED may be disposed on the first to fourth openings OP1, OP2, OP3, and OP4 of the first electrode RME1. The light-emitting elements ED may stop moving as they are in direct contact with the side surfaces of the first insulating layer PAS1 that is disposed between the first to fourth openings OP1, OP2, OP3, and OP4 on the first electrode RME1 and acts as a barrier.

In addition, as described above, the first n-type semiconductor layer 31 (see FIG. 10) and the second p-type semiconductor layer 32 (see FIG. 10) are disposed at the both ends of each of the light-emitting elements ED. Specifically, because the first semiconductor layer 31 is negatively charged while the second semiconductor layer 32 is positively charged, the negatively charged first semiconductor layer 31 may be directed toward the first electrode RME1 while the second semiconductor layer 32 may be deflected toward the second electrode RME2 or the third electrode RME3. Accordingly, the light-emitting elements ED may be aligned such that they are oriented in a direction crossing the direction in which the first electrode RME1 extends.

In the above-described first alignment process and second alignment process, each of the alignment signals may be direct current (DC) voltage. If an alignment signal in the form of AC voltage is applied to an electrode, an electric field may be formed in other adjacent electrodes than the electrode, for example, lines of a circuit layer thereunder, and accordingly the light-emitting elements ED may be disposed at undesirable locations. In contrast, according to the present embodiment, alignment signals in the form of DC voltage may be applied to align and arrange the light-emitting elements ED at desired locations.

Figure 19:
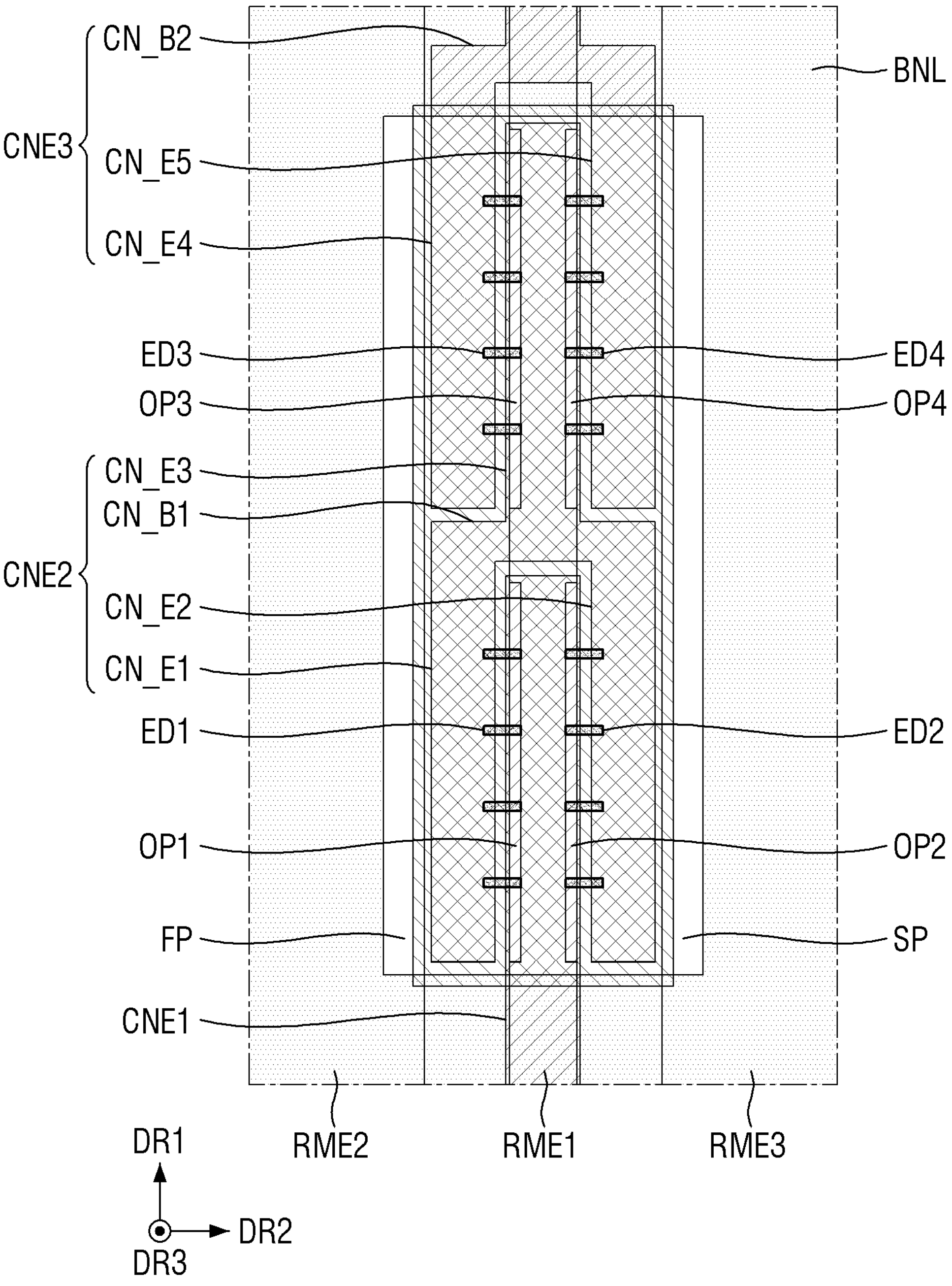

Subsequently, referring to FIG. 19, after the alignment process of the light-emitting elements ED has been completed, a second insulating layer PAS2 (see FIG. 6) may be formed on the light-emitting elements ED, and connection electrodes CNE1, CNE2, and CNE3 may be formed thereon, to fabricate a display device.

Hereinafter, display devices according to one or more embodiments of the present disclosure will be described with reference to other drawings.

Figure 20:
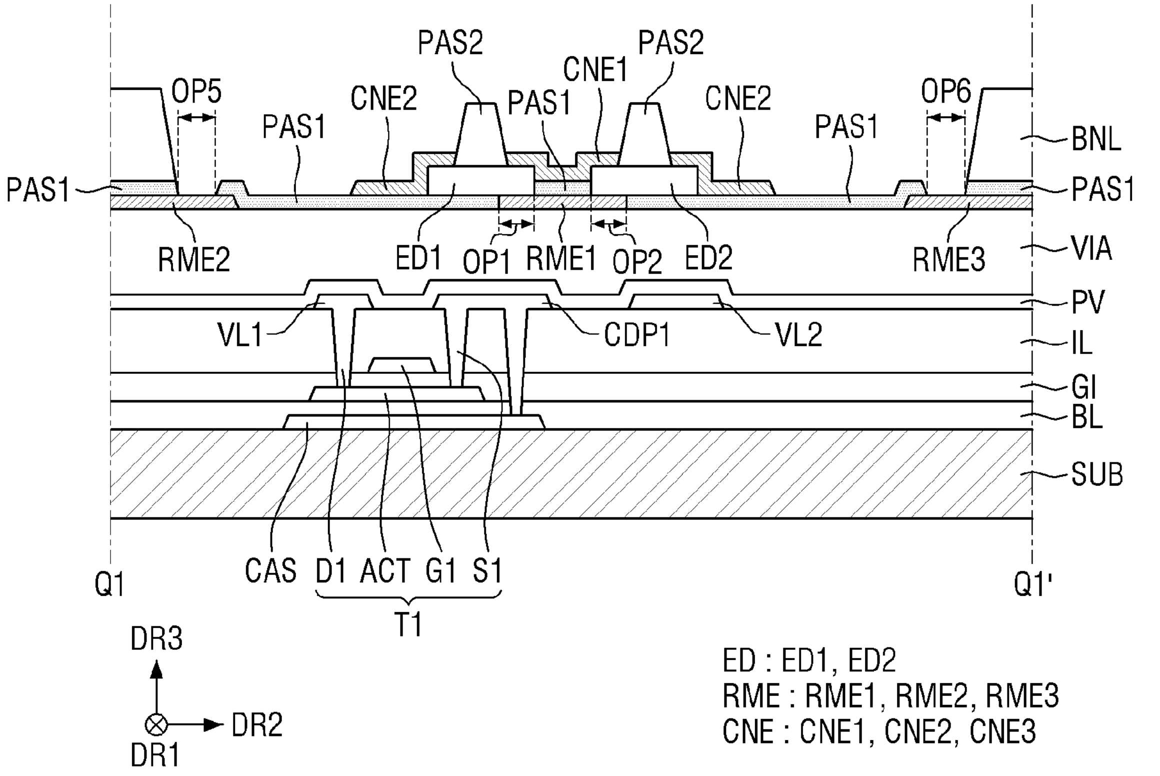
FIG. 20 is a cross-sectional view showing a display device according to one or more embodiments of the present disclosure.
Figure 21:
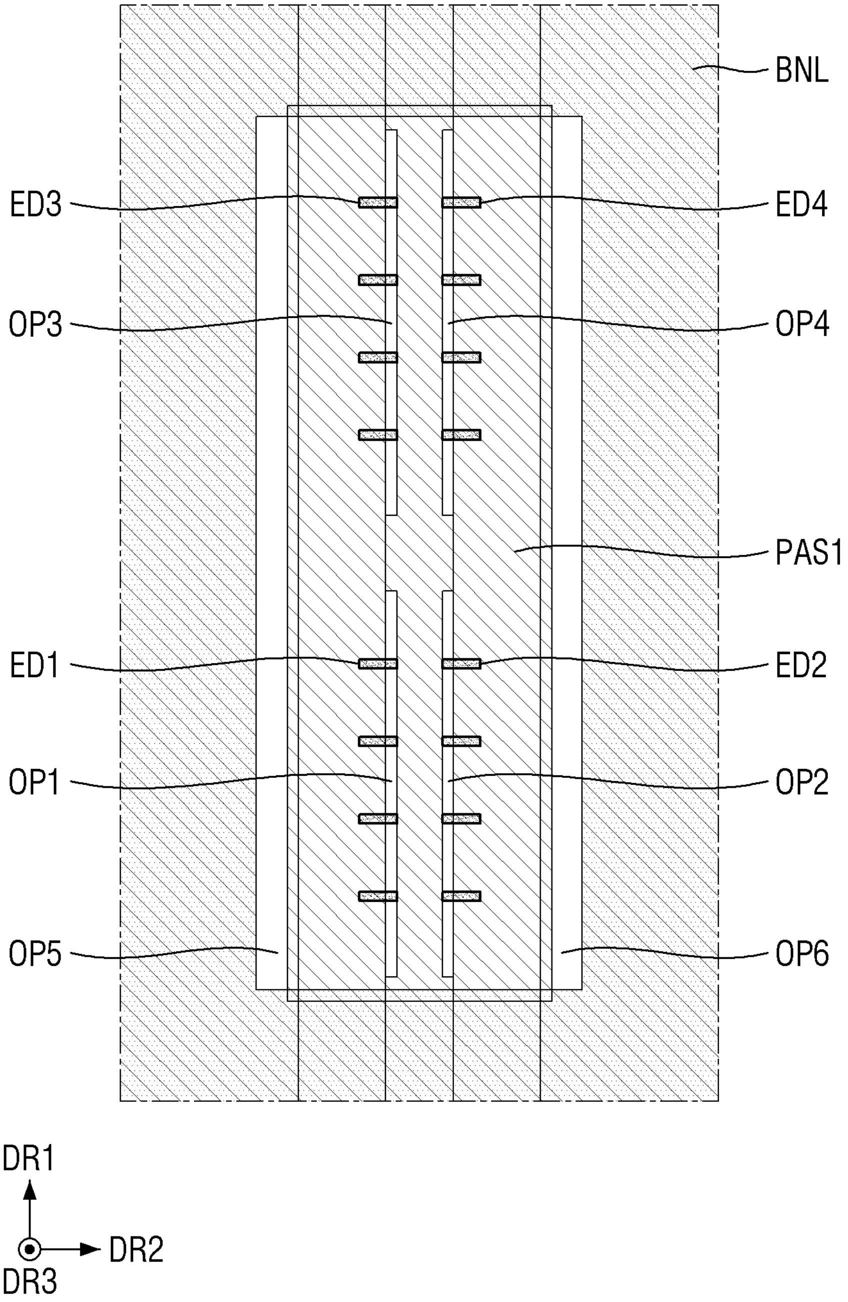
FIG. 21 is a plan view showing a bank layer and a first insulating layer according to one or more embodiments.

FIG. 20 is a cross-sectional view showing a display device according to one or more embodiments of the present disclosure. FIG. 21 is a plan view showing a bank layer and a first insulating layer according to one or more embodiments.

The embodiment shown in FIGS. 20 and 21 is substantially identical to the above-described embodiment shown in FIGS. 5 to 9 except that a first insulating layer PAS1 is disposed entirely on a substrate SUB; and, therefore, the redundant descriptions will be omitted.

The first insulating layer PAS1 may be disposed entirely on a via layer VIA of the substrate SUB. Specifically, the first insulating layer PAS1 may be disposed on the electrodes RME and the via layer VIA. The first insulating layer PAS1 may include a first opening OP1, a second opening OP2, a third opening OP3, and a fourth opening OP4 exposing parts of the first electrode RME1. The first to fourth openings OP1, OP2, OP3, and OP4 are identical to those described above with reference to FIGS. 5 to 7; and, therefore, the redundant descriptions will be omitted.

According to the present embodiment, the first insulating layer PAS1 may include a fifth opening OP5 exposing a second electrode RME2, and a sixth opening OP6 exposing a third electrode RME3. The fifth opening OP5 and the sixth opening OP6 may be located in the emission area EMA and may be extended in the first direction DR1. The fifth opening OP5 may be located on the left side in the emission area EMA and may be extended from the lower side to the upper side of the bank layer BNL. The sixth opening OP6 may be located on the right side in the emission area EMA and may be extended from the lower side to the upper side of the bank layer BNL. The fifth opening OP5 and the sixth opening OP6 may be arranged parallel to each other, and may be spaced from each other in the second direction DR2 with the plurality of openings OP1, OP2, OP3, and OP4 therebetween. The width of each of the fifth opening OP5 and the sixth opening OP6 in the second direction DR2 may be larger than the length of the light-emitting elements ED, so that all of the light-emitting elements ED are seated on the fifth opening OP5 and the sixth opening OP6 during the process of aligning the light-emitting elements ED. The width of each of the fifth opening OP5 and the sixth opening OP6 in the second direction DR2 may be equal to or greater than 5 μm.

The bank layer BNL may be disposed on the first insulating layer PAS1. For example, the bank layer BNL may completely overlap the first insulating layer PAS1 and may be disposed directly on the upper surface of the first insulating layer PAS1. A side surface of the first insulating layer PAS1 and a side surface of the bank layer BNL may be aligned with each other on a side of the fifth opening OP5. In addition, a side surface of the first insulating layer PAS1 and a side surface of the bank layer BNL may be aligned with each other on a side of the sixth opening OP6.

According to the present embodiment, the openings OP1 to OP6 of the first insulating layer PAS1 may be located wherever it is necessary to align the light-emitting elements ED. After the first insulating layer PAS1 is formed on the electrodes RME, the bank layer BNL may be patterned during a subsequent process. A developer used during the process of patterning the bank layer BNL may damage the electrodes RME. Therefore, according to the present embodiment, it is possible to prevent damage to the electrodes RME by forming the openings OP1 to OP6 in the first insulating layer PAS1 after the process of patterning the bank layer BNL.

Hereinafter, a process of fabricating the above-described first insulating layer PAS1 and the bank layer BNL will be described.

Figure 22:
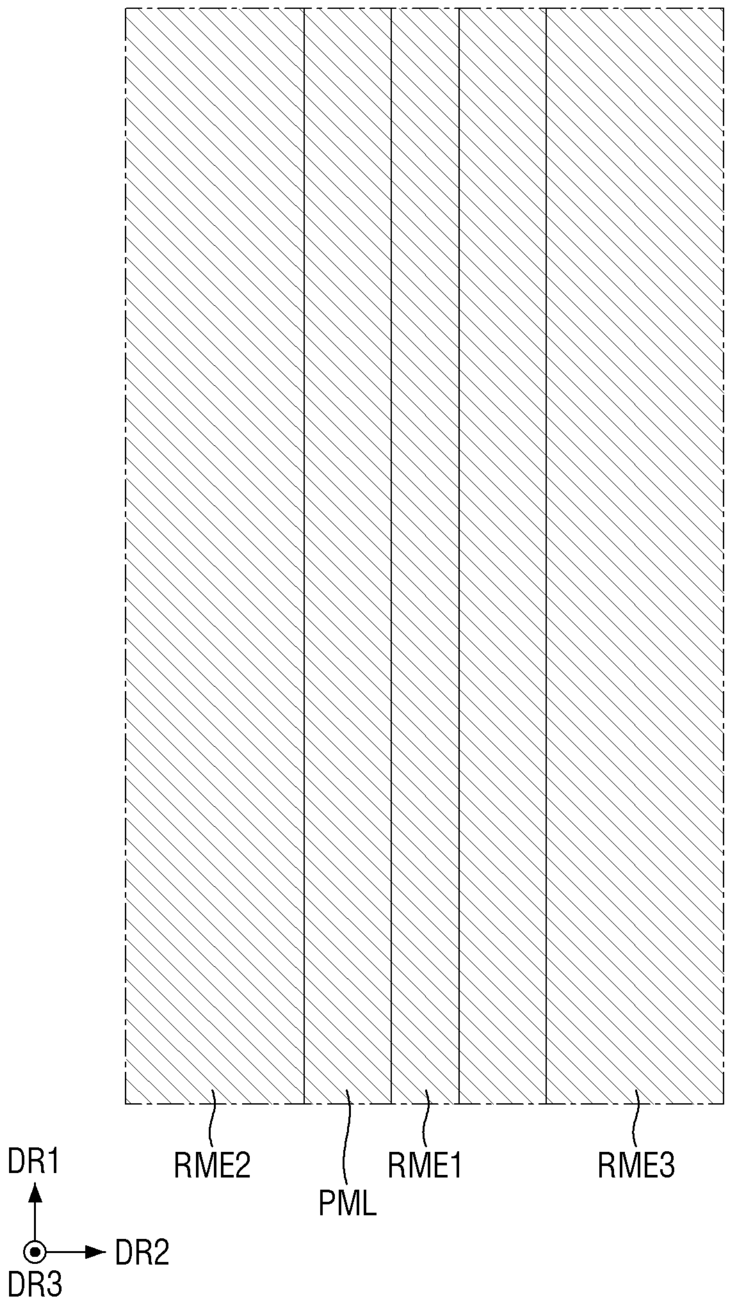
FIGS. 22-24 are plan views showing processing steps of fabricating a display device according to one or more embodiments of the present disclosure.
Figure 23:
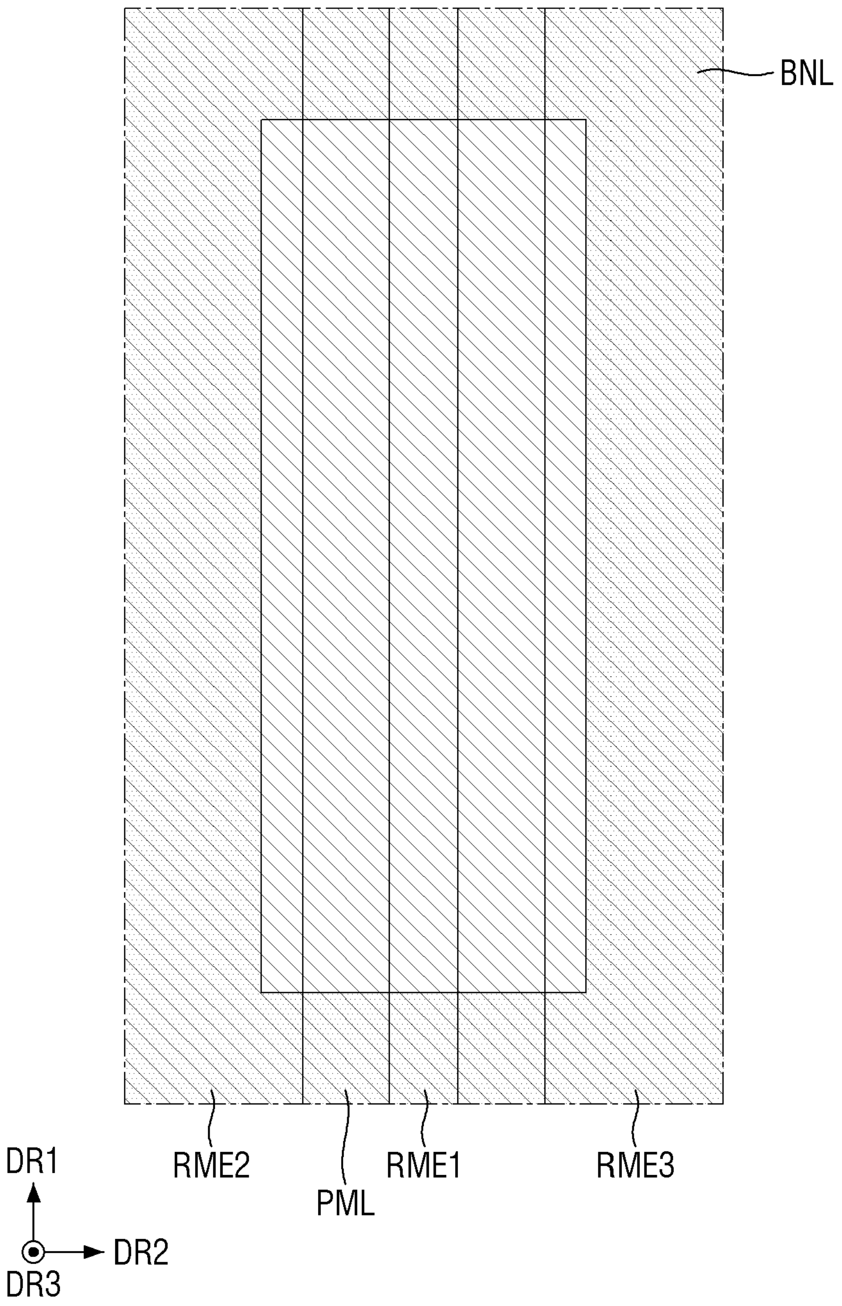
Figure 24:
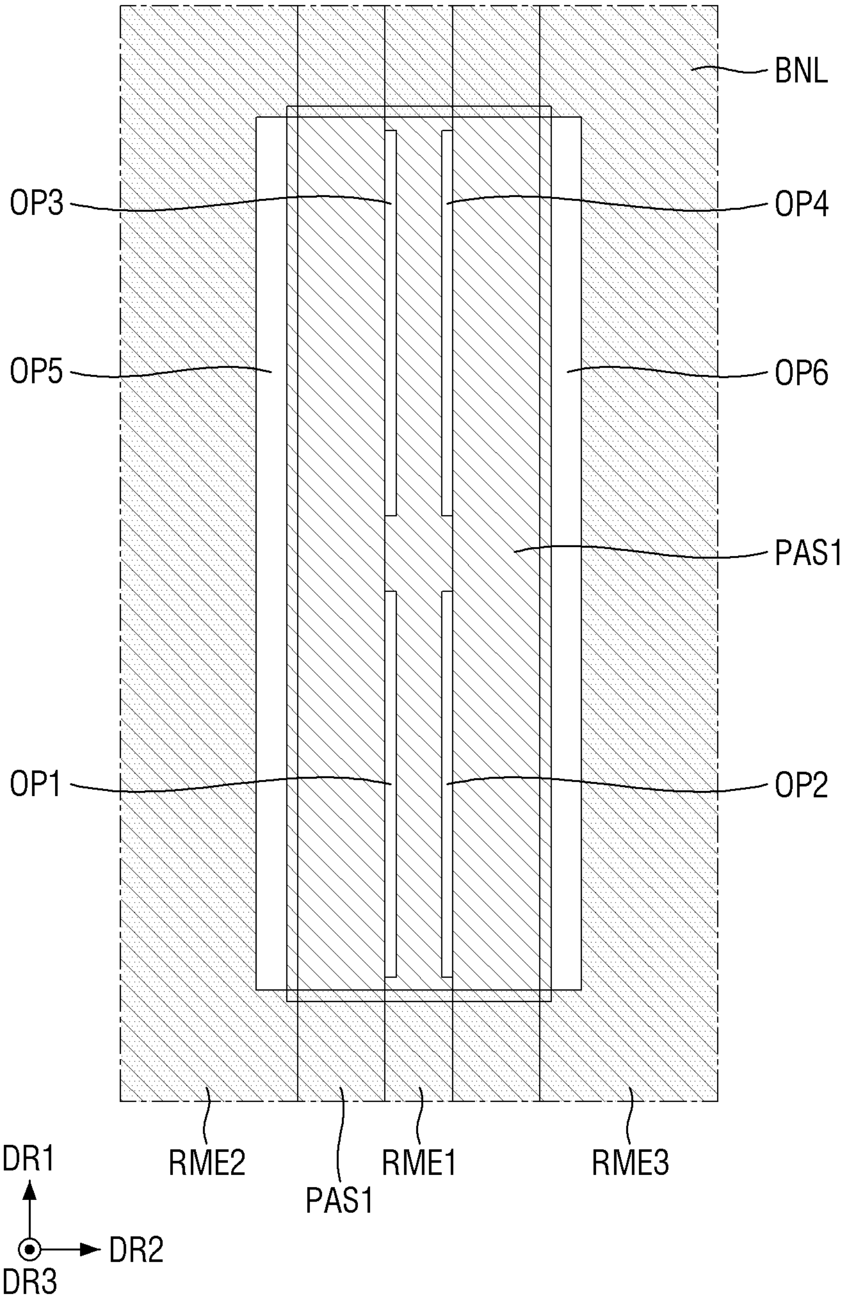

FIGS. 22-24 are plan views showing processing steps of fabricating a display device according to one or more embodiments of the present disclosure. In the following description, the processes of forming the electrodes RME, the light-emitting elements ED, and the connection electrodes CNE are identical to those FIGS. 11-19; and, therefore, the redundant descriptions will be omitted.

Referring to FIG. 22, an inorganic insulating material layer PML is deposited on the substrate on which the electrodes RME1, RME2, and RME3 are formed. The inorganic insulating material layer PML may be disposed entirely on the via layer in which the electrodes RME1, RME2, and RME3 are formed.

Subsequently, referring to FIG. 23, a bank layer BNL is formed on the inorganic insulating material layer PML. The bank layer BNL may be formed via a patterning process after applying a bank material. In doing so, because the electrodes RME1, RME2, and RME3 are covered and protected by the inorganic insulating material layer PML even though the developer used in the patterning process is applied, it is possible to prevent damage to the electrodes RME1, RME2, and RME3.

Subsequently, referring to FIG. 24, the inorganic insulating material layer PML is patterned to form a plurality of openings OP1, OP2, OP3, OP4, OP5, and OP6 to form the first insulating layer PAS1. The first to fourth openings OP1, OP2, OP3, and OP4 are formed to expose the first electrode RME1, the fifth opening OP5 is formed to expose the second electrode RME2, and the six opening OP6 is formed to expose the third electrode RME3.

Subsequently, the light-emitting elements ED and the connection electrodes CNE are formed in the same manner as in FIGS. 14 to 19 described above, to fabricate the display device 10.

Figure 25:
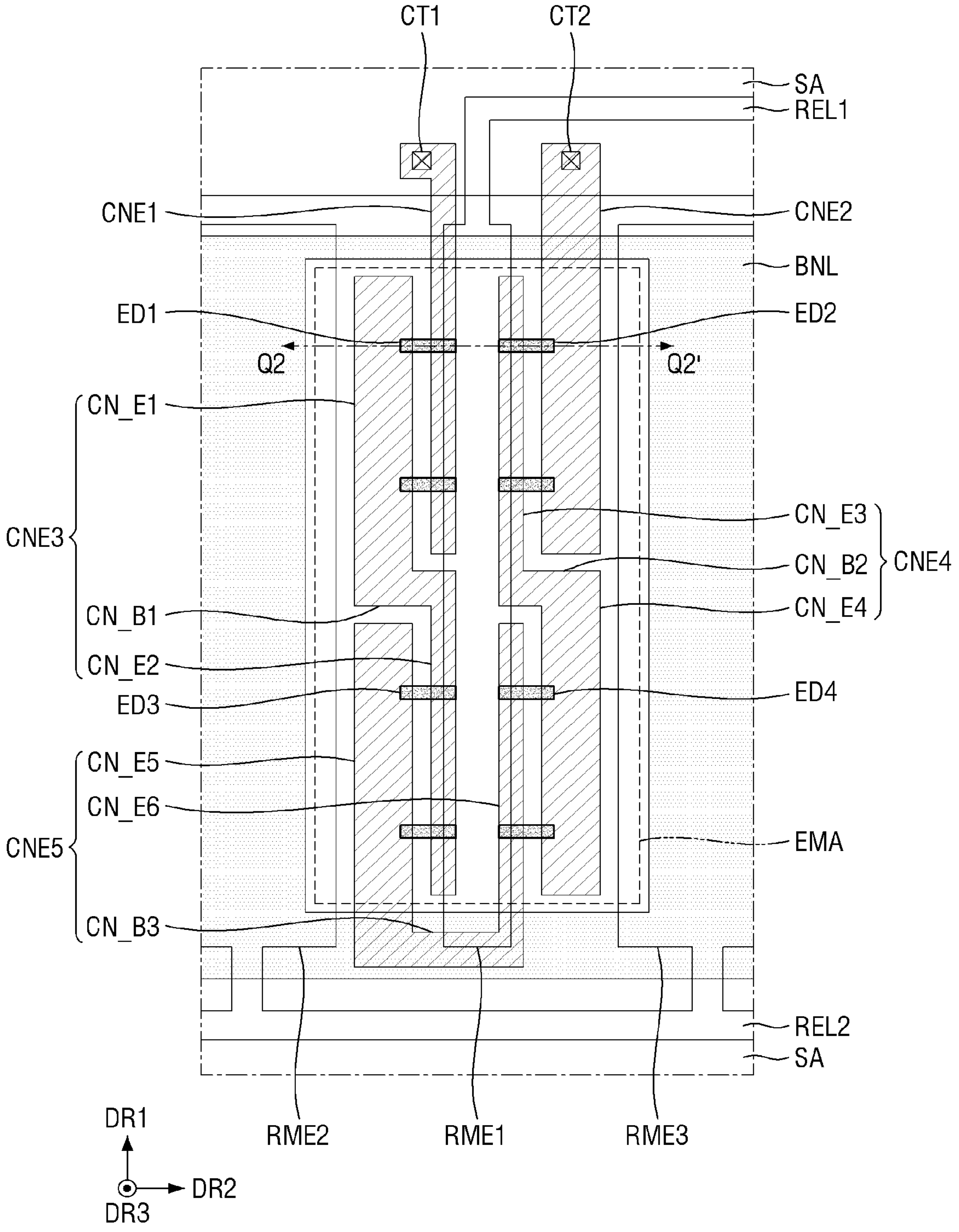
FIG. 25 is a plan view showing a first sub-pixel of a display device according to one or more embodiments of the present disclosure.
Figure 26:
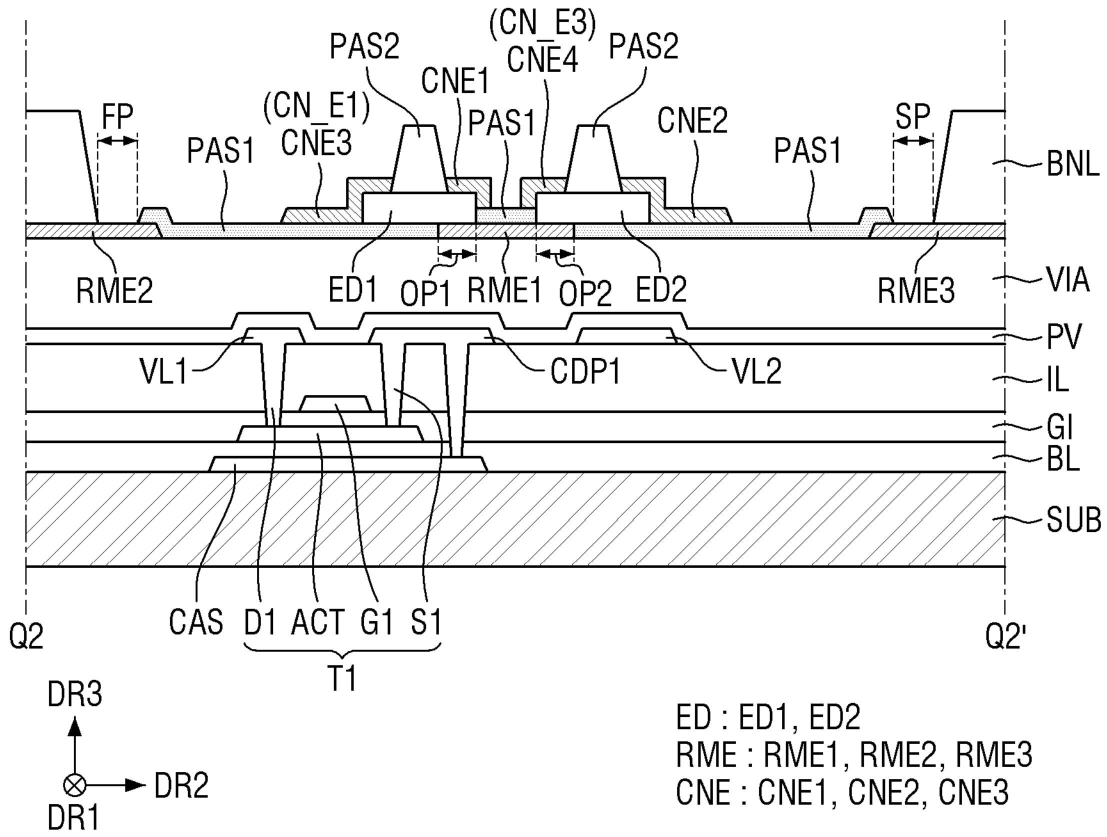
FIG. 26 is a cross-sectional view taken along the line Q2-Q2' of FIG. 25.

FIG. 25 is a plan view showing a first sub-pixel of a display device according to one or more embodiments of the present disclosure. FIG. 26 is a cross-sectional view taken along the line Q2-Q2' of FIG. 25.

The embodiment of FIGS. 25 and 26 is substantially identical to the above-described embodiments except that more connection electrodes CNE are included; and, therefore, the redundant descriptions will be omitted.

The plurality of connection electrodes CNE may include a first connection electrode CNE1, a third connection electrode CNE3, a fourth connection electrode CNE4, and a fifth connection electrode CNE5 disposed on a first electrode RME1; and a second connection electrode CNE2 not disposed on the first electrode RME1.

The first connection electrode CNE1 may be extended in the first direction DR1 and may overlap the first electrode RME1. The first connection electrode CNE1 may be disposed on the upper side of the center of the emission area EMA. The first connection electrode CNE1 may be disposed across the emission area EMA and the subsidiary area SA of the respective sub-pixel SPXn, and may be connected to a first conductive pattern CDP1 through a first contact CT1 formed in the subsidiary area SA.

The second connection electrode CNE2 may be extended in the first direction DR1 and may not overlap the first electrode RME1. The second connection electrode CNE2 may be spaced from the first connection electrode CNE1 with the first electrode RME1 therebetween. The second connection electrode CNE2 may be disposed on the upper side of the center of the emission area EMA. The second connection electrode CNE2 may be disposed across the emission area EMA and the subsidiary area SA of the respective sub-pixel SPXn, and may be connected to a second voltage line VL2 through a second contact CT2 formed in the subsidiary area SA.

The third connection electrode CNE3 may include a first extended portion CN_E1 facing the first connection electrode CNE1, a second extended portion CN_E2 disposed on the first electrode RME1, and a first bridge portion CN_B1 connecting between the first extended portion CN_E1 and the second extended portion CN_E2. The first extended portion CN_E1 may be spaced from and face the first connection electrode CNE1 in the second direction DR2, and the second extended portion CN_E2 may be spaced from the first connection electrode CNE1 in the first direction DR1. The first extended portion CN_E1 may be disposed on the upper side in the emission area EMA of the respective sub-pixel SPXn, and the second extended portion CN_E2 may be disposed on the lower side in the emission area EMA. The first bridge portion CN_B1 may be disposed across the first electrode RME1 in the center portion of the emission area EMA. The third connection electrode CNE3 may be generally extended in the first direction DR1 and may have a shape that is bent in the second direction DR2 and extended in the first direction DR1 again.

The fourth connection electrode CNE4 may include a third extended portion CN_E3 disposed on the first electrode RME1, a fourth extended portion CN_E4 facing the second extended portion CN_E2 of the third connection electrode CNE3, and a second bridge portion CN_B2 connecting between the third extended portion CN_E3 and the fourth extended portion CN_E4. The third extended portion CN_E3 may be spaced from and face the second connection electrode CNE2 in the second direction DR2, and the fourth extended portion CN_E4 may be spaced from and face the second extended portion CN_E2 of the third connection electrode CNE3 in the second direction DR2. The third extended portion CN_E3 may be disposed on the upper side in the emission area EMA of the respective sub-pixel SPXn, and the fourth extended portion CN_E4 may be disposed on the lower side in the emission area EMA. The second bridge portion CN_B2 may be disposed across the first electrode RME1 adjacent to the center portion of the emission area EMA. The fourth connection electrode CNE4 may be generally extended in the first direction DR1 and may have a shape that is bent in the second direction DR2 and extended in the first direction DR1 again.

The fifth connection electrode CNE5 may include a fifth extended portion CN_E5 not overlapping with the first electrode RME1, a sixth extended portion CN_E6 disposed on the first electrode RME1, and a third bridge portion CN_B3 connecting between the fifth extended portion CN_E5 and the sixth bridge portion CN_E6. The fifth extended portion CN_E5 may be spaced from and face the second extended portion CN_E2 of the third connection electrode CNE3 in the second direction DR2, and the sixth extended portion CN_E6 may be spaced from and face a fourth extended portion CN_E4 of the fourth connection electrode CNE4 in the second direction DR2. The fifth extended portion CN_E5 and the sixth extended portion CN_E6 may be disposed on the lower side in the emission area EMA, and the third bridge portion CN_B3 may be disposed across the first electrode RME1. The fifth connection electrode CNE5 may be disposed in a shape that is around (e.g., surrounds) the second extended portion CN_E2 of the third connection electrode CNE3.

The first connection electrode CNE1 and the second connection electrode CNE2 may be first-type connection electrodes connected to the third conductive layer, while the third connection electrode CNE3, the fourth connection electrode CNE4 and the fifth connection electrode CNE5 may be second-type connection electrodes connected to no other electrodes.

As described above, the plurality of light-emitting elements ED may be sorted into different light-emitting elements ED by the connection electrodes CNE with which their both ends are in contact, in accordance with the arrangement structure of the connection electrodes CNE.

The first ends of the first light-emitting elements ED1 and the second light-emitting elements ED2 may be in contact with the first-type connection electrodes, while the second ends thereof may be in contact with the second-type connection electrodes. The first light-emitting elements ED1 may be in contact with the first connection electrode CNE1 and the third connection electrode CNE3, and the second light-emitting elements ED2 may be in contact with the second connection electrode CNE2 and the fourth connection electrode CNE4. The first and second ends of the third light-emitting elements ED3 and the fourth light-emitting elements ED4 may be in contact with the second-type connection electrodes. The third light-emitting element ED3 may be in contact with the third connection electrode CNE3 and the fifth connection electrode CNE5, and the fourth light-emitting element ED4 may be in contact with the fourth connection electrode CNE4 and the fifth connection electrode CNE5.

The plurality of light-emitting elements ED may be connected in series to each other through the plurality of connection electrodes CNE. According to this embodiment, the display device 10 includes a large number of light-emitting elements ED for each of the sub-pixels SPXn to form the serial connection, thereby further increasing the amount of emitted light per unit area.

Figure 27:
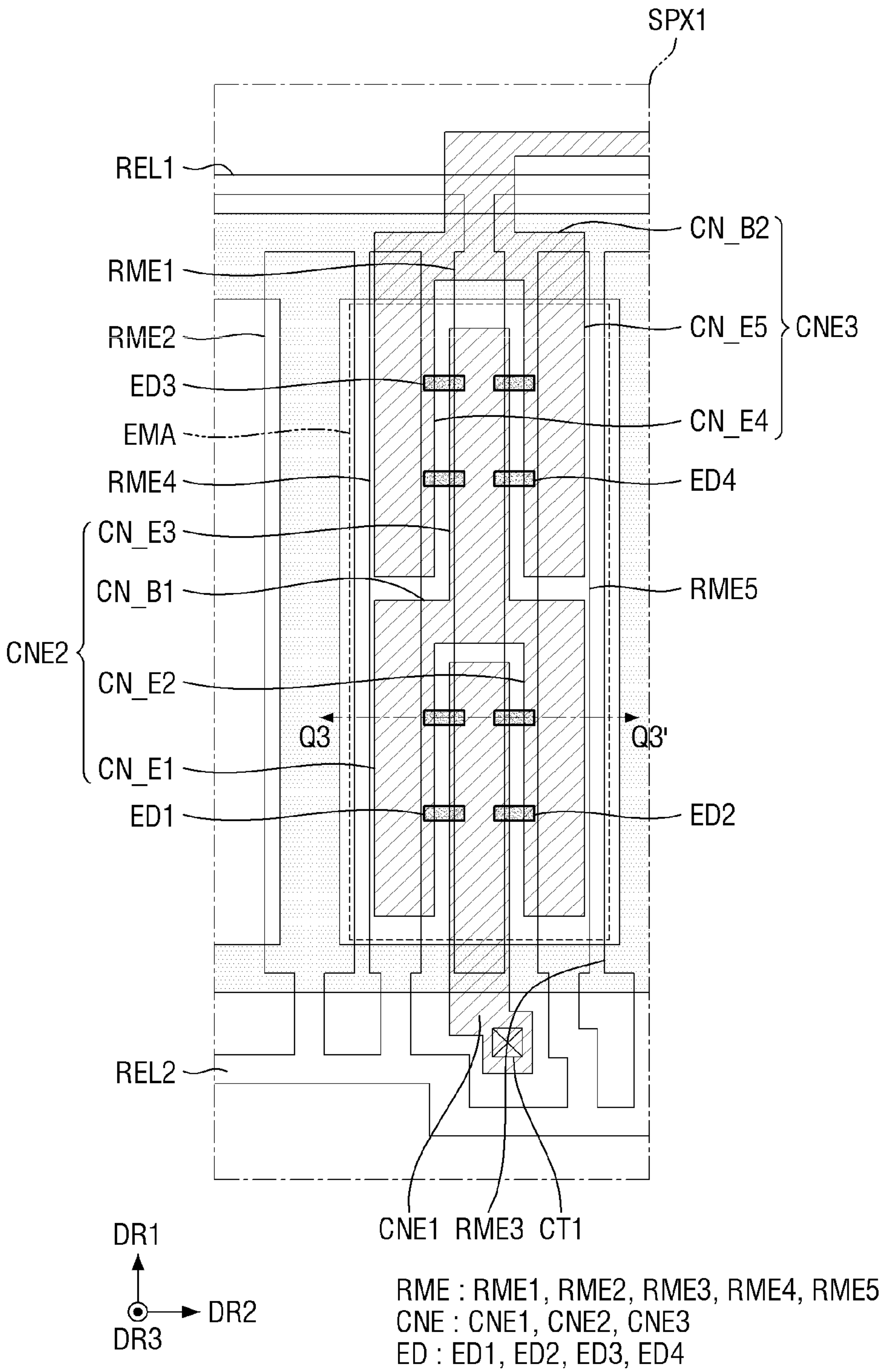
FIG. 27 is a plan view showing a first sub-pixel of a display device according to one or more embodiments of the present disclosure.
Figure 28:
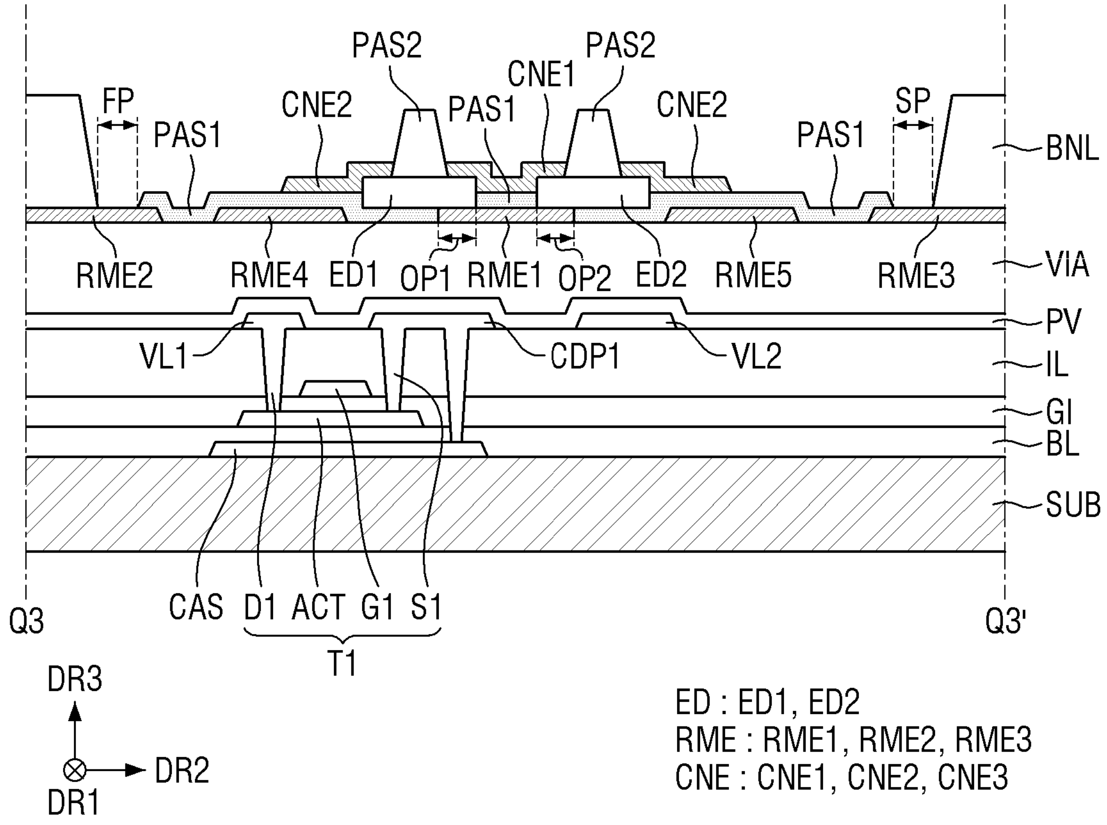
FIG. 28 is a cross-sectional view taken along the line Q3-Q3' of FIG. 27.

FIG. 27 is a plan view showing a first sub-pixel of a display device according to one or more embodiments of the present disclosure. FIG. 28 is a cross-sectional view taken along the line Q3-Q3' of FIG. 27.

The embodiment of FIGS. 27 and 28 is substantially identical to the above-described embodiment of FIGS. 5 to 7 except that the former further includes a fourth electrode RME4 and a fifth electrode RME5; and, therefore, the redundant descriptions will be omitted.

A fourth electrode RME4 and a fifth electrode RME5 may be disposed on a via layer VIA. The fourth electrode RME4 may be disposed between a first electrode RME1 and a second electrode RME2, and the fifth electrode RME5 may be disposed between the first electrode RME1 and a third electrode RME3. The fourth electrode RME4 and the fifth electrode RME5 may be spaced from each other in the second direction DR2 with the first electrode RME1 therebetween. The fourth electrode RME4 and the fifth electrode RME5 may be arranged in parallel with the first electrode RME1, the second electrode RME2, and the third electrode RME3 to face each other.

The first insulating layer PAS1 may cover the first to fifth electrodes RME1, RME2, RME3, RME4, and RME5. The first light-emitting elements ED1 and the third light-emitting elements ED3 may be disposed between the first electrode RME1 and the fourth electrode RME4, and the second light-emitting elements ED2 and the fourth light-emitting elements ED4 may be disposed between the first electrode RME1 and the fifth electrode RME5. The first ends of the first light-emitting elements ED1 and the third light-emitting elements ED3 may overlap and may be in contact with the first electrode RME1, and the second ends thereof may not overlap the fourth electrode RME4. The first ends of the second light-emitting elements ED2 and the fourth light-emitting elements ED4 may overlap and may be in contact with the first electrode RME1, and the second ends thereof may not overlap the fifth electrode RME5.

Each of the light-emitting elements ED may overlap the first electrode RME1 but not overlap the second electrode RME2, the third electrode RME3, the fourth electrode RME4, or the fifth electrode RME5. It should be understood, however, that the present disclosure is not limited thereto. The second ends of the first light-emitting elements ED1 and the third light-emitting elements ED3 may overlap the fourth electrode RME4, and the second ends of the second light-emitting elements ED2 and the fourth light-emitting elements ED4 may overlap the fifth electrode RME5.

In addition, the second connection electrode CNE2 and the third connection electrode CNE3 may overlap the fourth electrode RME4 and the fifth electrode RME5. Specifically, the first extended portion CN_E1 and the first bridge portion CN_B1 of the second connection electrode CNE2 may overlap the fourth electrode RME4, and the second extended portion CN_E2 and the first bridge portion CN_B1 of the second connection electrode CNE2 may overlap the fifth electrode RME5. The fourth extended portion CN_E4 and the second bridge portion CN_B2 of the third connection electrode CNE3 may overlap the fourth electrode RME4, and the fifth extended portion CN_E5 and the second bridge portion CN_B2 of the third connection electrode CNE3 may overlap the fifth electrode RME5.

The same alignment signal as the second and third electrodes RME2 and RME3 may be applied to the fourth and fifth electrodes RME4 and RME5. To this end, the fourth electrode RME4 and the fifth electrode RME5 may be connected to the second electrode line REL2 as one body.

Hereinafter, a method of aligning the light-emitting elements ED in the display device 10 having the structure of FIG. 27 will be described.

Figure 29:
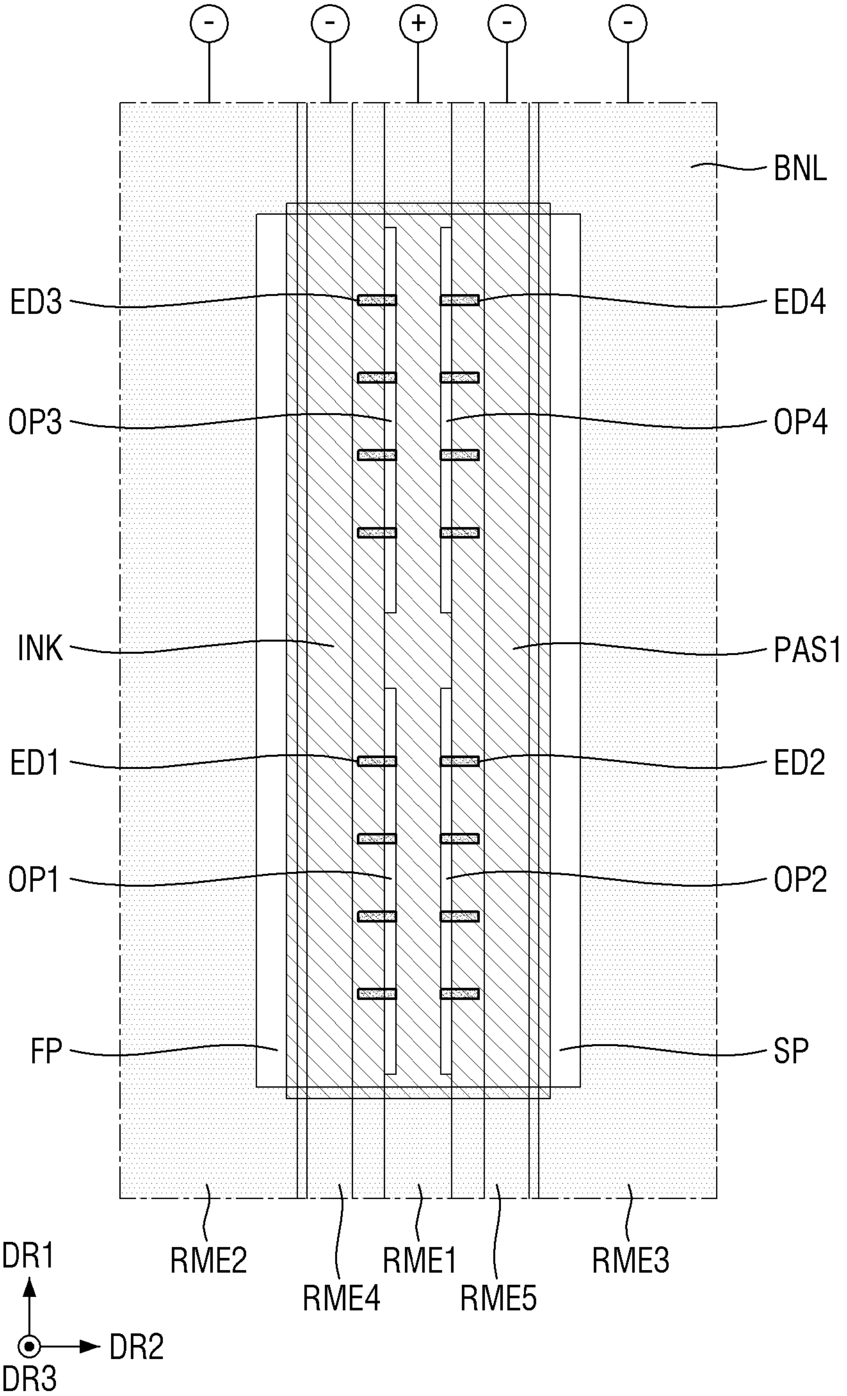
FIGS. 29 and 30 are plan views showing processing steps of fabricating a display device according to one or more embodiments of the present disclosure.
Figure 30:
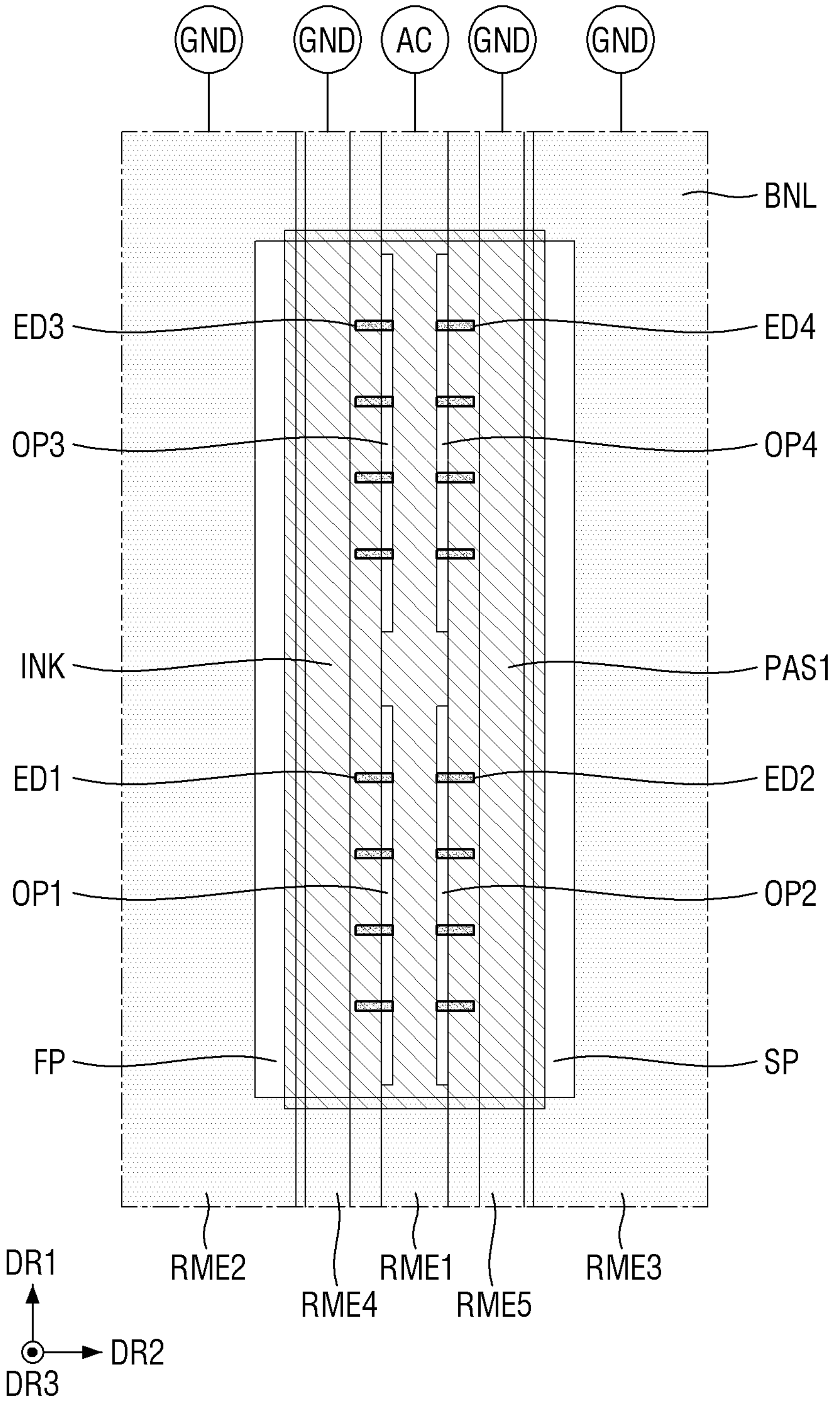

FIGS. 29 and 30 are plan views showing processing steps of fabricating a display device according to one or more embodiments of the present disclosure. In FIGS. 29 and 30, processes of arranging light-emitting elements ED and drying an ink INK will be described. The other fabrication processes are identical to those of FIGS. 11-19 described above; and, therefore, the redundant descriptions will be omitted.

Referring to FIG. 29, a substrate on which first to fifth electrodes RME1, RME2, RME3, RME4, and RME5, a first insulating layer PAS1 and a bank layer BNL are formed is prepared. The first to fifth electrodes RME1, RME2, RME3, RME4, and RME5 may be formed concurrently (e.g., simultaneously). Subsequently, an ink INK containing light-emitting elements ED is sprayed onto the substrate, and the second alignment process described above with reference to FIGS. 17 and 18 is performed.

Specifically, by applying a positive voltage to the first electrode RME1 and applying a negative voltage to the second to fifth electrodes RME2, RME3, RME4, and RME5, the light-emitting elements ED may be disposed on the first to fourth openings OP1, OP2, OP3, and OP4 of the first electrode RME1.

Subsequently, referring to FIG. 30, after the process of aligning the light-emitting elements ED is finished, a drying process of removing a solvent from the ink INK is performed. In the drying process, the solvent of the ink INK may be removed by performing heat treatment on the substrate. Before performing the drying process, it is necessary to fix the light-emitting elements ED to prevent the light-emitting elements ED from being misaligned during the drying process.

According to the present embodiment, the light-emitting elements ED may be fixed on the first electrode RME1 by applying an AC signal to the electrodes RME to generate an electric field. Specifically, before the drying process, an alternating current (AC) voltage is applied to the first electrode RME1 while a constant voltage is applied to the second to fifth electrodes RME2, RME3, RME4, and RME5, so that an electric field is generated between the first electrode RME1 and the second to fifth electrodes RME2, RME3, RME4, and RME5. The constant voltage may be the ground potential GND or a low-level voltage lower than the alternating current (AC) voltage applied to the first electrode RME1. Because the light-emitting elements ED are already aligned by the above-described second alignment process, the generated electric field can maintain the aligned light-emitting elements ED.

In the drying process, the solvent of the ink INK may be completely removed by performing heat treatment on the substrate in a low-pressure environment. According to one or more embodiments of the present disclosure, the process of removing the solvent may be carried out under a pressure of $10^{-4}$ Torr to 1 Torr at a temperature of 100° C. to 400° C. When the heat treatment is performed within the above pressure range, the boiling point of the solvent is lowered and thus can be more easily removed. The heat treatment may be performed in the chamber for 1 minute to 30 minutes. It is, however, to be understood that the present disclosure is not limited thereto.

After the drying process is completed, the application of the AC signal to the electrodes RME may be interrupted, to end the process of aligning the light-emitting elements ED. In subsequent processes, a second insulating layer and connection electrodes may be formed as shown in FIG. 19 described above, to fabricate the display device 10.

As described above, in the display device according to the embodiment, a plurality of openings exposing the first electrode is formed in the first insulating layer PAS1, and a direct current signal is applied to align the light-emitting elements ED, so that it is possible to control the positions where the light-emitting elements ED are finally aligned and to improve the alignment degree.

Figure 31:
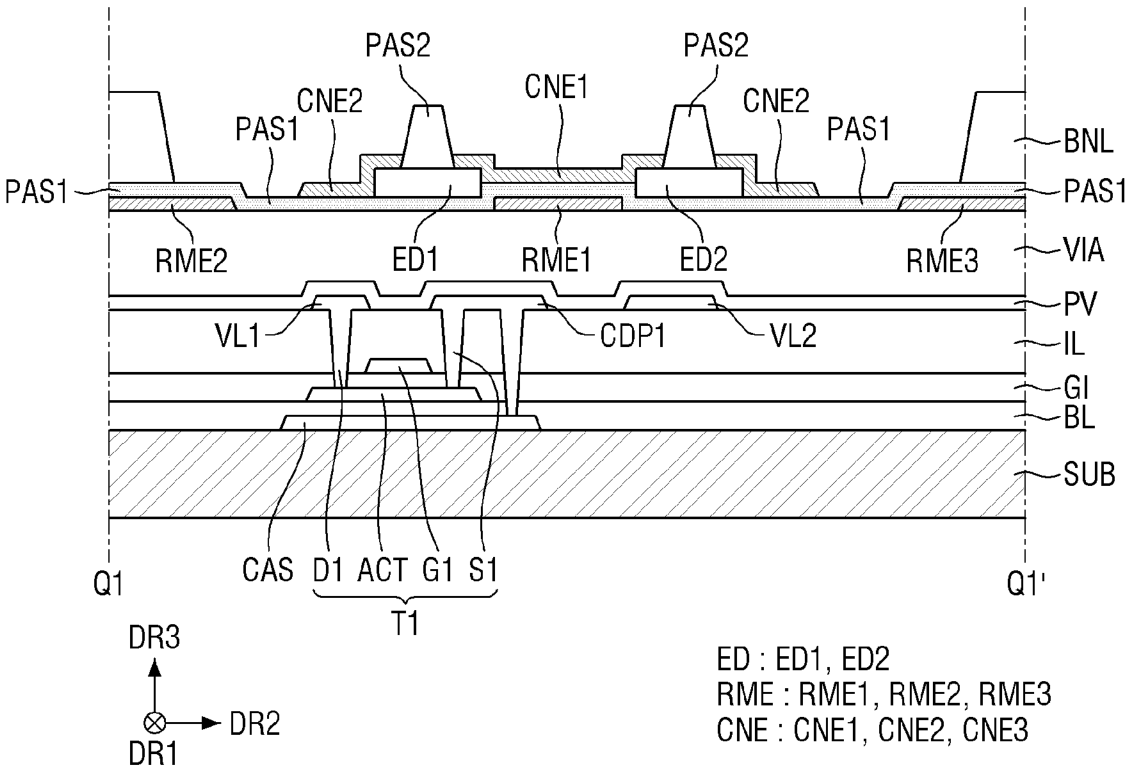
FIG. 31 is a cross-sectional view showing a display device according to one or more embodiments of the present disclosure.

FIG. 31 is a cross-sectional view showing a display device according to one or more embodiments of the present disclosure.

The embodiment of FIG. 31 is substantially identical to the embodiment of FIG. 5 except that a plurality of openings in the first insulating layer PAS1 is eliminated; and, therefore, the redundant descriptions will be omitted.

The first insulating layer PAS1 may be disposed entirely on a via layer VIA of the substrate SUB. Specifically, the first insulating layer PAS1 may be disposed on the electrodes RME and the via layer VIA. The first insulating layer PAS1 may be disposed to cover the electrodes RME1, RME2, and RME3.

The light-emitting elements ED may be disposed on the first insulating layer PAS1. The light-emitting elements ED may be spaced from the first electrode RME1 with the first insulating layer PAS1 therebetween. In addition, the light-emitting elements ED may not overlap the first electrode RME1 and may have one ends adjacent to the first electrode RME1. The first insulating layer PAS1 may have steps due to the first electrodes RME1 thereunder. The first ends of the light-emitting elements ED may be in contact with the steps of the first insulating layer PAS1. The steps of the first insulating layer PAS1 may work as a barrier when the light-emitting elements ED are aligned, so that the light-emitting elements ED may come into contact with the steps and stop moving.

The light-emitting elements ED may be aligned via the first and second alignment processes described above with reference to FIGS. 15 to 18. For example, when a negative voltage is applied to the first electrode RME1 and a positive voltage is applied to the second electrode RME2 and the third electrode RME3 during the first alignment process, the light-emitting elements ED move to the second electrode RME2 and the third electrode RME3. Subsequently, when a positive voltage is applied to the first electrode RME1 and a negative voltage is applied to the second electrode RME2 and the third electrode RME3 during the second alignment process, the light-emitting elements ED may move to the first electrode RME1 and may be aligned in an area adjacent to the first electrode RME1.

In the display device according to the above-described embodiment, a DC signal is applied to each of the electrodes RME1, RME2, and RME3 to align the light-emitting elements, so that it is possible to control the positions where the light-emitting elements are finally aligned and to improve the alignment degree of the light-emitting elements.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:

a substrate;

a first electrode, a second electrode, and a third electrode extending in a first direction on the substrate and spaced from each other;

a first insulating layer on the first electrode, the second electrode and the third electrode and comprising openings exposing an upper surface of the first electrode;

a bank layer on the first electrode, the second electrode, the third electrode, and the first insulating layer to partition an emission area;

light-emitting elements on the first electrode and the first insulating layer; and a first connection electrode in contact with one ends of the light-emitting elements and a second connection electrode in contact with opposite ends of the light-emitting elements, wherein the light-emitting elements are in contact with the upper surface of the first electrode through the openings of the first insulating layer.

2. The display device of claim 1, wherein the openings comprise a first opening exposing one side of the upper surface of the first electrode and a second opening exposing an opposite side of the upper surface of the first electrode, and wherein the first opening and the second opening are extended in the first direction and arranged in parallel to each other.

3. The display device of claim 2, wherein the first insulating layer comprises a third opening exposing an upper surface of the second electrode and a fourth opening exposing an upper surface of the third electrode, and wherein a width of each of the third opening and the fourth opening in a second direction crossing the first direction is greater than a length of the light-emitting elements.

4. The display device of claim 2, wherein the light-emitting elements comprise a first light-emitting element between the first electrode and the second electrode, and a second light-emitting element between the first electrode and the third electrode, wherein the first light-emitting element is in contact with the upper surface of the first electrode through the first opening, and wherein the second light-emitting element is in contact with the upper surface of the first electrode through the second opening.

5. The display device of claim 4, wherein a first end of the first light-emitting element overlaps the first electrode, and a second end of the first light-emitting element does not overlap the first electrode and the second electrode, and wherein a first end of the second light-emitting element overlaps the first electrode, and a second end of the second light-emitting element does not overlap the first electrode and the third electrode.

6. The display device of claim 5, wherein the first light-emitting element and the second light-emitting element are spaced from each other with the first insulating layer between the first opening and the second opening, and wherein the first end of the first light-emitting element and the first end of the second light-emitting element are in contact with side surfaces of the first insulating layer, respectively.

7. The display device of claim 5, wherein the first connection electrode is in contact with the first end of the first light-emitting element and the first end of the second light-emitting element, and wherein the second connection electrode is in contact with the second end of the first light-emitting element and the second end of the second light-emitting element.

8. The display device of claim 7, wherein the second connection electrode comprises a first extended portion extending in the first direction, a second extended portion spaced from and facing the first extended portion, and a first bridge portion connecting between the first extended portion and the second extended portion, and wherein the first extended portion is in contact with the second end of the first light-emitting element, and the second extended portion is in contact with the second end of the second light-emitting element.

9. The display device of claim 8, wherein the openings comprise a third opening spaced from the first opening in the first direction and exposing the one side of the upper surface of the first electrode, and a fourth opening spaced from the second opening in the first direction and exposing the opposite side of the upper surface of the first electrode, wherein the light-emitting elements comprises a third light-emitting element between the first electrode and the second electrode and a fourth light-emitting element between the first electrode and the third electrode, and wherein the third light-emitting element is in contact with the upper surface of the first electrode through the third opening, and the fourth light-emitting element is in contact with the upper surface of the first electrode through the fourth opening.

10. The display device of claim 9, wherein the second connection electrode comprises a third extended portion extending in the first direction from the first bridge portion, wherein the display device further comprises a third connection electrode comprising a fourth extended portion extending in the first direction and spaced from the first extended portion in the first direction, a fifth extended portion extending in the first direction and spaced from the second extended portion in the first direction, and a second bridge portion connecting between the fourth extended portion and the fifth extended portion, wherein the third extended portion is in contact with a first end of the third light-emitting element and a first end of the fourth light-emitting element, and wherein the fourth extended portion is in contact with a second end of the third light-emitting element, and the fifth extended portion is in contact with a second end of the fourth light-emitting element.

11. The display device of claim 1, wherein the first insulating layer is extended from a top of the first electrode in a second direction crossing the first direction to cover an edge of the second electrode and an edge of the third electrode.

12. The display device of claim 1, wherein the second electrode comprises a first region that does not overlap the bank layer and the first insulating layer and exposes an upper surface of the second electrode, and wherein the third electrode comprises a second region that does not overlap the bank layer and the first insulating layer and exposes an upper surface of the third electrode.

13. The display device of claim 12, wherein the first region and the second region are extended in the first direction and are arranged in parallel to each other, and a width of each of the first region and the second region in the second direction is greater than a length of the light-emitting elements.

14. A display device comprising:

a substrate;

a first electrode, a second electrode, a third electrode, a fourth electrode, and a fifth electrode extending in a first direction on the substrate and spaced from one another;

a first insulating layer on the first electrode, the second electrode, the third electrode, the fourth electrode, and the fifth electrode and comprising openings exposing an upper surface of the first electrode;

a bank layer on the first electrode, the second electrode, the third electrode, the fourth electrode, the fifth electrode, and the first insulating layer to partition an emission area;

light-emitting elements on the first electrode and the first insulating layer; and a first connection electrode in contact with one ends of the light-emitting elements and a second connection electrode in contact with opposite ends of the light-emitting elements, wherein the light-emitting elements are in contact with the upper surface of the first electrode through the openings of the first insulating layer, and wherein the light-emitting elements do not overlap with the second electrode, the third electrode, the fourth electrode, and the fifth electrode.

15. The display device of claim 14, wherein the second electrode is spaced from one side of the first electrode, the third electrode is spaced from an opposite side of the first electrode, the fourth electrode is between the first electrode and the second electrode, and the fifth electrode is between the first electrode and the third electrode.

16. The display device of claim 15, wherein the light-emitting elements comprise a first light-emitting element between the first electrode and the fourth electrode, and a second light-emitting element between the first electrode and the fifth electrode.

17. The display device of claim 16, wherein a first end of the first light-emitting element overlaps the first electrode, and a second end of the first light-emitting element does not overlap the fourth electrode, and wherein a first end of the second light-emitting element overlaps the first electrode, and a second end of the second light-emitting element does not overlap the fifth electrode.

18. A method of fabricating a display device, the method comprising:

forming a first electrode, a second electrode, and a third electrode spaced from each other on a substrate;

forming a first insulating layer comprising openings on the first electrode, the second electrode, and the third electrode to expose parts of an upper surface of the first electrode;

forming a bank layer on the first electrode, the second electrode, the third electrode, and the first insulating layer to define an emission area;

spraying ink containing light-emitting elements onto the emission area;

performing a first alignment process of aligning the light-emitting elements on the second electrode and the third electrode by applying a first alignment signal to the first electrode, the second electrode, and the third electrode;

performing a second alignment process of aligning the light-emitting elements on the first electrode by applying a second alignment signal to the first electrode, the second electrode, and the third electrode; and forming a first connection electrode in contact with first ends of the light-emitting elements and a second connection electrode in contact with second ends of the light-emitting elements.

19. The method of claim 18, wherein the first insulating layer is formed via a patterning process to form a first region in which an upper surface of the second electrode is exposed and a second region in which an upper surface of the third electrode is exposed.

20. The method of claim 19, wherein the first alignment process is performed by applying the first alignment signal in a form of a DC voltage to the first electrode, the second electrode and the third electrode, and a negative voltage is applied to the first electrode and a positive voltage is applied to the second electrode and the third electrode as the first alignment signal.

21. The method of claim 20, wherein in the first alignment process, the light-emitting elements are aligned and arranged on the first region of the second electrode and the second region of the third electrode.

22. The method of claim 19, wherein the second alignment process is performed by applying the second alignment signal in a form of a DC voltage to the first electrode, the second electrode, and the third electrode, and a positive voltage is applied to the first electrode and a negative voltage is applied to the second electrode and the third electrode as the second alignment signal.

23. The method of claim 22, wherein in the second alignment process, the light-emitting elements are aligned on the first electrode and are in direct contact with the upper surface of the first electrode through the openings.

24. The method of claim 18, further comprising:

forming a fourth electrode between the first electrode and the second electrode; and forming a fifth electrode between the first electrode and the third electrode, wherein the first electrode, the second electrode, the third electrode, the fourth electrode, and the fifth electrode are formed concurrently.

25. The method of claim 24, further comprising:

performing a drying process of removing a solvent from the ink after the second alignment process, wherein during the drying process, an AC voltage is applied to the first electrode and a constant voltage is applied to the second electrode, the third electrode, the fourth electrode, and the fifth electrode.

* * * * *